(12) United States Patent
Yamaguchi

(10) Patent No.: US 11,563,020 B2
(45) Date of Patent: Jan. 24, 2023

(54) SEMICONDUCTOR METHOD FOR MANUFACTURING A DEVICE INCLUDING SILICIDES OF DIFFERENT COMPOSITION CONCENTRATIONS ON THE GATE ELECTRODE AND DIFFUSION REGIONS

(71) Applicant: Renesas Electronics Corporation, Tokyo (JP)

(72) Inventor: Tadashi Yamaguchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 398 days.

(21) Appl. No.: 16/515,352

(22) Filed: Jul. 18, 2019

(65) Prior Publication Data

US 2019/0341395 A1    Nov. 7, 2019

Related U.S. Application Data

(62) Division of application No. 15/509,148, filed as application No. PCT/JP2015/057897 on Mar. 17, 2015, now abandoned.

(51) Int. Cl.
*H01L 29/49* (2006.01)
*H01L 21/28* (2006.01)
(Continued)

(52) U.S. Cl.
CPC .. *H01L 27/11563* (2013.01); *H01L 21/28052* (2013.01); *H01L 27/1157* (2013.01);
(Continued)

(58) Field of Classification Search
CPC ........ H01L 27/11563; H01L 21/28052–28061; H01L 21/823418; H01L 21/823443; H01L 21/823814; H01L 21/823835
See application file for complete search history.

(56) References Cited

U.S. PATENT DOCUMENTS

2007/0278587 A1    12/2007  Aoyama et al.
2009/0081836 A1    3/2009   Liu et al.
(Continued)

FOREIGN PATENT DOCUMENTS

JP    2007-335834 A    12/2007
JP    2009-239172 A    10/2009
(Continued)

OTHER PUBLICATIONS

Chinese Office Action, dated Mar. 25, 2020, in Chinese Application No. 201580052591.x and English Translation thereof.
(Continued)

*Primary Examiner* — Matthew C Landau
*Assistant Examiner* — Mark Hatzilambrou
(74) *Attorney, Agent, or Firm* — McGinn I.P. Law Group, PLLC

(57) ABSTRACT

A method for manufacturing a semiconductor device to provide a Metal Insulator Semiconductor Field Effect Transistor (MISFET) in a first region of a semiconductor substrate includes forming a first gate insulating film on the semiconductor substrate in the first region, forming a first gate electrode containing silicon on the first gate insulating film, forming first impurity regions inside the semiconductor substrate so as to sandwich the first gate electrode in the first region, the first impurity regions configuring a part of a first source region and a part of a first drain region, forming a first silicide layer on the first impurity region, forming a first insulating film on the semiconductor substrate so as to cover the first gate electrode and the first silicide layer, polishing the first insulating film so as to expose the first gate electrode, and forming a second silicide layer on the first gate electrode.

11 Claims, 10 Drawing Sheets

(51) Int. Cl.
  *H01L 29/78*     (2006.01)
  *H01L 29/45*     (2006.01)
  *H01L 29/66*     (2006.01)
  *H01L 27/11563*   (2017.01)
  *H01L 29/792*    (2006.01)
  *H01L 27/1157*    (2017.01)
  *H01L 27/11573*   (2017.01)
  *H01L 29/51*     (2006.01)

(52) U.S. Cl.
  CPC ........ *H01L 27/11573* (2013.01); *H01L 29/45* (2013.01); *H01L 29/4933* (2013.01); *H01L 29/517* (2013.01); *H01L 29/66507* (2013.01); *H01L 29/66545* (2013.01); *H01L 29/78* (2013.01); *H01L 29/7833* (2013.01); *H01L 29/792* (2013.01); *H01L 29/4966* (2013.01)

(56) References Cited

U.S. PATENT DOCUMENTS

| | | |
|---|---|---|
| 2009/0243002 A1 | 10/2009 | Sonehara et al. |
| 2010/0075481 A1 | 3/2010 | Yang |
| 2011/0037103 A1 | 2/2011 | Yamaguchi et al. |
| 2012/0126297 A1* | 5/2012 | Yamaguchi ......... H01L 21/6875 257/E21.409 |
| 2012/0292708 A1 | 11/2012 | Chen et al. |
| 2013/0122670 A1* | 5/2013 | Duong ................. H01L 21/324 438/197 |
| 2013/0149854 A1 | 6/2013 | Ishii et al. |
| 2013/0189839 A1* | 7/2013 | Guillorn ........... H01L 29/41775 438/675 |
| 2014/0077310 A1 | 3/2014 | Ishii et al. |
| 2014/0227843 A1* | 8/2014 | Tsukamoto ....... H01L 27/11568 438/275 |
| 2014/0242796 A1 | 8/2014 | Toba et al. |
| 2016/0118394 A1 | 4/2016 | Toba et al. |
| 2016/0225902 A1 | 8/2016 | Toba et al. |

FOREIGN PATENT DOCUMENTS

| | | |
|---|---|---|
| JP | 2011-040641 A | 2/2011 |
| JP | 2014-093422 A | 5/2014 |
| JP | 2014-154790 A | 8/2014 |
| TW | 201322426 A | 6/2013 |
| TW | 201438195 A | 10/2014 |
| WO | WO 2006/129637 A | 12/2006 |

OTHER PUBLICATIONS

Taiwanese Office Action, dated Jun. 27, 2019, in Taiwanese Application No. 104144081 and English Translation thereof.

International Search Report (ISR) (PCT Form PCT/ISA/210), in PCT/JP2015/057897, dated Apr. 28, 2015.

Japanese Office Action, dated Jul. 3, 2018, in Japanese Application No. 2017-191199 and English Translation thereof.

United States Office Action dated Mar. 19, 2019 in U.S. Appl. No. 15/509,148.

United States Office Action dated Oct. 16, 2018 in U.S. Appl. No. 15/509,148.

United States Office Action dated Apr. 30, 2018 in U.S. Appl. No. 15/509,148.

* cited by examiner

SEMICONDUCTOR METHOD FOR MANUFACTURING A DEVICE INCLUDING SILICIDES OF DIFFERENT COMPOSITION CONCENTRATIONS ON THE GATE ELECTRODE AND DIFFUSION REGIONS

The present application is a Divisional Application of U.S. patent application Ser. No. 15/509,148, filed on Mar. 6, 2017, which is based on International Patent Application No. PCT/JP2015/057897, filed on Mar. 17, 2015, the entire contents of which are incorporated herein by reference.

TECHNICAL FIELD

The present invention relates to a semiconductor device and a method for manufacturing the same, and is preferably applicable to, for example, a semiconductor device having a nonvolatile memory and a method for manufacturing the same.

BACKGROUND ART

As a semiconductor device having a memory cell of an electrically writable/erasable nonvolatile memory, a memory cell including a conductive floating gate electrode surrounded by an oxide film or a trapping insulating film sandwiched by an oxide film below the gate electrode of the MISFET is widely used. The latter is referred to as a MONOS (Metal Oxide Nitride Oxide Semiconductor) type including a single gate type cell and a split gate type cell, and is used as a nonvolatile memory of a microcomputer.

In accordance with achievement of lower power consumption and high integration of the microcomputer, a transistor including a metal gate electrode and a high dielectric constant film (high-k film) is used in a logic portion. As a method for forming such a transistor, so-called a gate-last process is known, the gate-last process forming a source/drain region by using a dummy gate electrode made of a polycrystalline silicon film on a substrate, and then, replacing the dummy gate electrode with a metal gate electrode.

In the gate last process, after a silicide layer is formed on the source/drain region of various MISFETs, an element is covered with an interlayer insulating film, and then, an upper surface of the interlayer insulating film is polished to expose an upper surface of the gate electrode. For this reason, when a silicide layer is formed on a gate electrode configuring a memory cell and being made of a semiconductor film, it is required to form the silicide layer again after the polishing process.

Patent Document 1 (Japanese Patent Application Laid-open Publication No. 2014-154790) describes a case of mixedly mounting the memory cell and the MISFET of the logic portion, in which a silicide layer is formed on a source/drain region of the MISFET, subsequently a metal gate electrode of the MISFET is formed by the gate-last process, and then, a silicide layer is formed on the gate electrode of the memory cell.

Patent Document 2 (Japanese Patent Application Laid-Open Publication No. 2007-335834) describes a configuration in which in order to set an appropriate threshold value voltage in an n-type FET and a p-type FET having a full silicide gate, in the n-type FET, a gate electrode made of nickel silicide having a nickel content higher than a silicon content is formed on the gate insulating film with an aluminum layer being interposed therebetween. Moreover, it is described that in the p-type FET, a gate electrode made of nickel silicide having a nickel content higher than a silicon content is formed on the gate insulating film. Furthermore, on the surface of the source/drain region of the n-type FET and the p-type FET, a silicide layer is formed.

RELATED ART DOCUMENTS

Patent Documents

Patent Document 1: Japanese Patent Application Laid-Open Publication No. 2014-154790
Patent Document 2: Japanese Patent Application Laid-Open Publication No. 2007-335834

SUMMARY OF THE INVENTION

Problems to be Solved by the Invention

In a semiconductor device having a nonvolatile memory that has been studied by the inventor of the present application, the gate electrode of the MISFET of the logic part is formed by using the gate last process. That is, a first silicide layer is formed on the memory cell and the source/drain region of the MISFET of the logic part, and the metal gate electrode of the MISFET of the logic part is formed, and then, a second silicide layer is formed on the gate electrode of the MISFET of the memory cell. Meanwhile, the first silicide layer and the second silicide layer have the same composition as each other.

An object of the present application is to ensure reliability of a semiconductor device. Moreover, another object is to improve a performance of the semiconductor device.

Other object and novel characteristics will be apparent from the description of the present specification and the accompanying drawings.

Means for Solving the Problems

According to one embodiment, the MISFET has a gate electrode formed on a semiconductor substrate via a gate insulating film and a source/drain region formed inside the semiconductor substrate so as to sandwich the gate electrode. A first silicide layer is formed on a surface of the source/drain region, and a second silicide layer is formed on a surface of the gate electrode. Each of the first silicide layer and the second silicide layer is made of a first metal and silicon, and contains a second metal different from the first metal. Moreover, a concentration of the second metal in the second silicide layer is lower than a concentration of the second metal in the first silicide layer.

Effects of the Invention

According to one embodiment, the reliability of the semiconductor device can be ensured. Moreover, the performance of the semiconductor device can be improved.

BRIEF DESCRIPTIONS OF THE DRAWINGS

FIG. 1 is a cross-sectional view of a principal part of a semiconductor device according to one embodiment;
FIG. 2 is a cross-sectional view of a principal part during a manufacturing process of the semiconductor device of one embodiment;
FIG. 3 is a cross-sectional view of a principal part during a manufacturing process of the semiconductor device, continued from FIG. 2;

BEST MODE FOR PERFORMING THE INVENTION

Hereinafter, embodiments of the present invention will be described in detail based on the accompanying drawings. Note that components having the same function are denoted by the same reference symbols throughout all the drawings for describing the embodiments, and the repetitive description thereof will be omitted. Also, in the following embodiments, explanation of the same or similar parts is not repeated in principle unless particularly required.

In addition, symbols "−" and "+" represent relative concentrations of impurities whose conductivity type is n-type or p-type. For example, in the case of n-type impurities, the impurity concentrations increase in the order of "n−" to "n+".

A semiconductor device (semiconductor integrated circuit device) of the present embodiment is a semiconductor device including a nonvolatile memory (a nonvolatile storage element, a flash memory) such as a microcomputer. The microcomputer includes a CPU (Central Processing Unit), a RAM (Random Access Memory), an EEPROM (Electrically Erasable Programmable Read Only Memory), a flash memory and an I/O (Input/Output) circuit, etc. The CPU requires high-speed operations and low power consumption, and therefore, is configured by a MISFET (MISFET: Metal Insulator Semiconductor Field Effect Transistor) being driven at a low voltage (for example, 5V or less) and having a low breakdown voltage with a low threshold value. The EEPROM or the flash memory has a plurality of nonvolatile memory cells disposed into a matrix form, and a control circuit for performing writing, erasing and reading operations on the nonvolatile memory cells. Particularly, in the writing and erasing operations, since a high voltage is applied to the nonvolatile memory cells, a MISFET being driven at a high voltage (for example, 10V or more) and having a high breakdown voltage is included in the control circuit.

The nonvolatile memory will be explained while exemplifying a memory cell based on an n-channel type MISFET. However, a p-channel type MISFET may be exemplified. The CPU and control circuit are configured by an n-channel type MISFET and a p-channel type MISFET. However, here, the explanation will be made while exemplifying an n-channel type MISFET.

<Configuration of Semiconductor Device>

Figure 1:
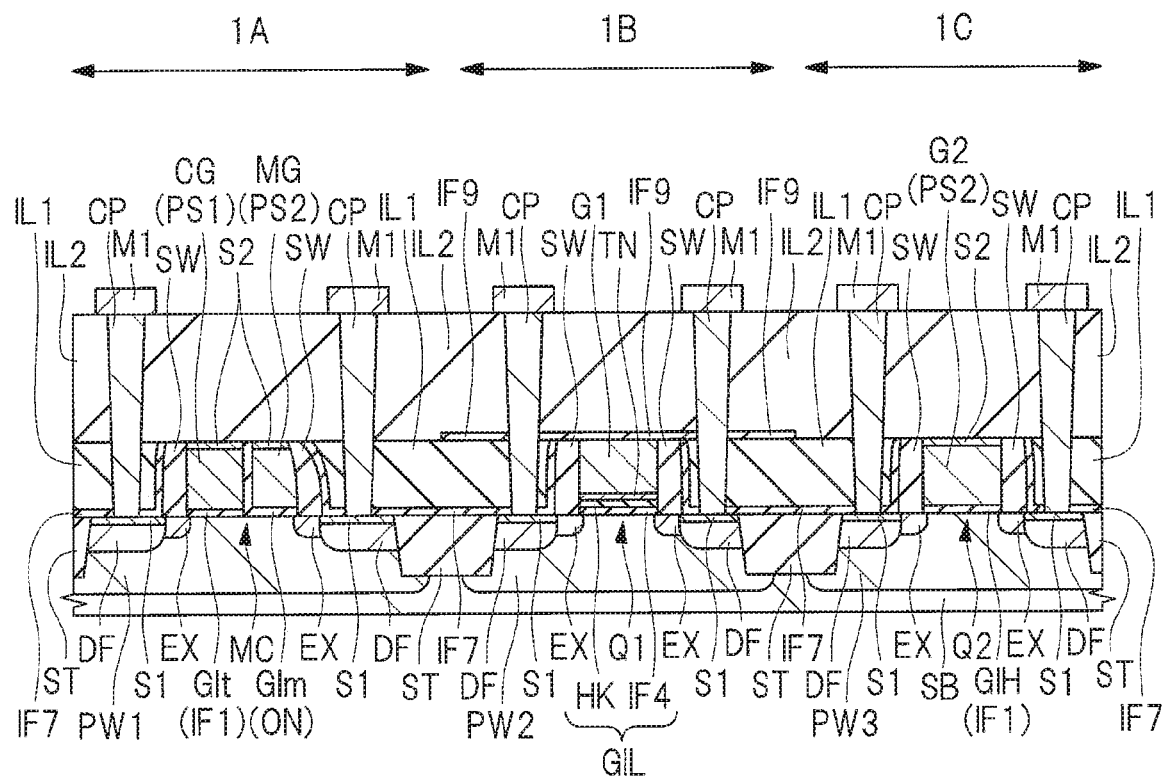

FIG. 1 is a cross-sectional view of a principal part of the semiconductor device of the present embodiment. FIG. 1 shows a memory cell region 1A on the left side, a peripheral circuit region 1B at the center, and a peripheral circuit region 1C on the right side. A memory cell MC of a nonvolatile memory is formed in the memory cell region 1A, a low breakdown voltage MISFET (Q1) is formed in the peripheral circuit region 1B, and the high breakdown voltage MISFET (Q2) is formed in the peripheral circuit region 1C. As described above, when the reference symbol portion is indefinite, parentheses are given to the reference symbol.

As shown in FIG. 1, the semiconductor device is formed on the main surface of the semiconductor substrate SB. The semiconductor substrate SB is a semiconductor wafer made of, for example, a p-type single crystal silicon or others having a specific resistance in a range of about 1 to 10 Ωcm. In the present embodiment, in order to achieve the high speed operation of the p-channel type MISFET, the channel direction (direction connecting the source region and the drain region) of the p-channel type MISFET on the (100) plane of the single crystal silicon substrate is set to <110> or <100>. Moreover, the channel direction of the n-channel type MISFET (direction connecting the source region and the drain region) thereon is also set to <110> or <100>.

First, the configuration of the n-channel type memory cell MC formed in the memory cell region 1A will be described.

In the memory cell region 1A, the semiconductor device has an active region and an element isolation region ST formed on the main surface of the semiconductor substrate SB. The element isolation region ST is used for isolating elements (memory cells) formed in the active region. In the element isolation region ST, an element isolation film made of a silicon oxide film or others is formed. The active region is surrounded by the element isolation region ST, and is defined, that is, partitioned by the element isolation region ST. Although not shown, the memory cell region 1A has a plurality of the active regions, and the plurality of active regions are electrically isolated from each other by the element isolation region ST. In the memory cell region 1A, a p-type well PW1 having a p-conductivity type on which the plurality of memory cells MC are disposed is formed.

The memory cell MC is a memory cell of a split gate type. In other words, as shown in FIG. 1, the memory cell MC is formed inside the p-type well PW1, and has the control gate electrode CG and the memory gate electrode MG. The memory cell MC has an n-type extension region (n⁻-type semiconductor region, low concentration region, impurity diffusion region) EX, an n-type diffusion region (n⁺-type semiconductor region, a high concentration region, an impurity diffusion region) DF, a control gate electrode CG, and a memory gate electrode MG. Each of the n-type extension region EX and the n-type diffusion region DF has an n-conductivity type that is an opposite conductivity type to the p-conductivity type.

Moreover, the memory cell MC has a silicide layer (gate silicide layer) S2 formed on the upper surface of the control gate electrode CG and the upper surface of the memory gate electrode MG, and also has a silicide layer (SD silicide layer) S1 formed on the upper surface of the diffusion region DF.

Furthermore, the memory cell MC has a gate insulating film GIt formed between the control gate electrode CG and the semiconductor substrate SB (or the p-type well PW1) and a gate insulating film GIm formed between the memory gate electrode MG and the semiconductor substrate SB (or the p-type well PW1) and between the memory gate electrode MG and the control gate electrode CG.

The control gate electrode CG and the memory gate electrode MG are extended along the main surface of the semiconductor substrate SB and disposed side by side between their opposed side surfaces to each other, that is, between their sidewalls, via the gate insulating film GIm. Each extending direction of the control gate electrode CG and the memory gate electrode MG is a direction perpendicular to the drawing sheet of FIG. 1. In the plurality (for example, several tens to several hundreds) of memory cells MC arranged in the direction perpendicular to the drawing sheet of FIG. 1, the control gate electrode CG is integrally formed in common with one another. Moreover, as similar to the control gate electrode CG, in the plurality (for example, several tens to several hundreds) of memory cells MC, the memory gate electrode MG is integrally formed in common with one another. In other words, in order to achieve the high-speed operations of the nonvolatile memory, it is important to achieve the low resistances of the control gate electrode CG and the memory gate electrode MG.

The control gate electrode CG and the memory gate electrode MG are adjacent to each other via the gate insulating film GIm therebetween, and the memory gate electrode MG is formed in a sidewall spacer form on the side surfaces, that is, the sidewalls of the control gate electrode CG via the gate insulating film GIm. Moreover, the gate insulating film GIm is extended over a region between the memory gate electrode MG and the semiconductor substrate SB and a region between the memory gate electrode MG and the control gate electrode CG.

The gate insulating film GIt is made of an insulating film IF1. The insulating film IF1 is made of a silicon oxide film, a silicon nitride film, an oxynitride silicon film, or a high dielectric constant film having a dielectric constant (relative permittivity) higher than that of the silicon nitride film, that is, a so-called High-k film. In the present embodiment, when the High-k film or the high dielectric constant film is described, note that this means a film having a dielectric constant (relative permittivity) higher than that of the silicon nitride film. As the insulating film IF1, for example, a metal oxide film such as a hafnium oxide film, a zirconium oxide film, an aluminum oxide film, a tantalum oxide film or a lanthanum oxide film can be used.

The gate insulating film GIm is made of an insulating film ON. The insulating film ON is configured by a stacked film including a silicon oxide film OX1, a silicon nitride film NT formed on the silicon oxide film OX1 and a silicon oxide film OX2 formed on the silicon nitride film NT. The gate insulating film GIm located between the memory gate electrode MG and the control gate electrode CG functions as an insulating film for insulating a gap between the memory gate electrode MG and the control gate electrode CG, that is, for electrically isolating these electrodes from each other. Therefore, the insulating film between the memory gate electrode MG and the control gate electrode CG may be formed as an insulating film that is separated or different from the insulating film between the memory gate electrode MG and the semiconductor substrate SB.

The silicon nitride film NT of the insulating films ON is an insulating film for storing charges, and functions as a charge storage portion. That is, the silicon nitride film NT is a trapping insulating film formed in the insulating film ON. For this reason, the insulating film ON can be regarded as an insulating film having a charge storage portion therein.

The silicon oxide film OX1 and the silicon oxide film OX2 located on the upper and lower sides of the silicon nitride film NT are allowed to function as charge block layers for trapping the charges inside. That is, by providing a configuration in which the silicon nitride film NT is sandwiched by the silicon oxide film OX1 and the silicon oxide film OX2, leakage of the charges stored in the silicon nitride film NT can be prevented.

The control gate electrode CG is made of a silicon film PS1. The silicon film PS1 is made of silicon, and is made of, for example, an n-type polysilicon film or others serving as a polycrystal silicon film to which an n-type impurity is introduced. More specifically, the control gate electrode CG is made of a patterned silicon film PS1. On the upper surface of the silicon film PS1 forming the control gate electrode CG, a silicide layer S2 is formed. The silicide layer S2 is also extended in a direction perpendicular to the surface sheet of FIG. 1 as similar to the control gate electrode CG.

The memory gate electrode MG is made of a silicon film PS2. The silicon film PS2 is made of silicon, and is made of, for example, a p-type polysilicon film or others serving as a polycrystal silicon film to which a p-type impurity is introduced. The memory gate electrode MG is formed in a sidewall spacer form on one sidewall of the control gate electrode CG adjacent to this memory gate electrode MG via the gate insulating film GIm. On the upper surface of the silicon film PS2 forming the memory gate electrode MG, a silicide layer S2 is formed. The silicide layer S2 is also extended in a direction perpendicular to the surface sheet of FIG. 1 as similar to the memory gate electrode MG.

FIG. 1 separately shows the control gate electrode CG and the silicide layer S2. However, they are sometimes referred to as control gate electrode so as to include the silicide layer S2. A relation between the memory gate electrode MG and the silicide layer S2 is similarly described.

The silicide layer S2 formed on each upper surface of the control gate electrode CG and the memory gate electrode MG is an alloy layer of nickel (Ni) and silicon (Si) containing platinum (Pt) as an additive. The content (content rate) of platinum is preferably less than 5% (including 0%).

Although described in detail later, by reducing the content of platinum in the silicide layer S2, increase in the sheet resistance of the control gate electrode CG and the memory gate electrode MG can be prevented.

The extension region EX and the diffusion region DF are semiconductor regions functioning as a source region or a drain region. Each of the extension region EX and the diffusion region DF is made of a semiconductor region to which an n-type impurity is introduced, and both of them form an LDD (Lightly doped drain) structure. The diffusion region DF has a concentration higher than that of the extension region EX, and also has a large junction depth relative to the well region PW1. The paired extension region EX and the diffusion region DF are disposed on both ends of the control gate electrode CG and the memory gate electrode MG so as to sandwich the control gate electrode CG and the memory gate electrode MG therebetween. However, the extension regions EX are disposed between one of the diffusion regions DF and the control gate electrode CG and between the other diffusion region DF and the memory gate electrode MG.

A silicide layer S1 is formed on the diffusion region DF, that is, on the upper surface (surface) of the diffusion region DF. The silicide layer S1 formed on the upper surface of the diffusion region DF is an alloy layer of nickel (Ni) and silicon (Si) that contains platinum (Pt) as an additive. The content (content rate) of the platinum (Pt) is 5% or more (more preferably, 5% or more and 10% or less). By setting the content of platinum (Pt) serving as an additive to 5% or more, abnormal growth of the silicide layer S1 is suppressed, so that a leak current in the source region or the drain region can be reduced. Moreover, by setting the content of platinum (Pt) to 10% or less, an unreacted portion of the nickel (Ni) film containing platinum (Pt) can be easily removed in a manufacturing method to be described later. Note that a region including the extension region EX, the diffusion region DF and the silicide layer S1 is sometimes represented as the source region or the drain region.

In place of the nickel silicide layer containing an additive, each of the silicide layers S1 and S2 may be a cobalt silicide layer containing the additive, and the additive may be aluminum (Al) or carbon (C).

On the sidewalls of the control gate electrode CG and the sidewalls of the memory gate electrode MG, a sidewall spacer SW made of an insulating film such as a silicon oxide film, a silicon nitride film or a stacked film of these films is formed.

Next, the configuration of an n-channel-type low breakdown voltage MISFET (Q1) formed in the peripheral circuit region 1B will be described.

In the peripheral circuit region 1B, the semiconductor device has an active region and an element isolation region ST formed on the main surface of the semiconductor substrate SB. The structure and the functions of the element isolation region ST are as described above. The active region is defined, that is, partitioned by the element isolation region ST, is electrically isolated from other active region in the peripheral circuit region 1B by the element isolation region ST, and a p-type well PW2 having a p-conductivity type is formed in the active region. The p-type well PW1 in the memory cell region 1A is surrounded by an n-type well not shown, and is electrically isolated from the p-type well PW2. That is, a potential different from that of the p-type well PW2 can be applied to the p-type well PW1.

As shown in FIG. 1, the low breakdown voltage MISFET (Q1), which is formed in the peripheral circuit region 1B, has an n-type extension region (n$^-$-type semiconductor region, low concentration region, impurity diffusion region) EX and an n-type diffusion region (n$^+$-type semiconductor region, high concentration region, impurity diffusion region) DF that are formed inside the p-type well PW2 and serve as the gate electrode G1 and the source region or the drain region. Moreover, the low breakdown voltage MISFET (Q1) has the silicide layer (SD silicide layer) S1 formed on the upper surface of the diffusion region DF. The silicide layer (SD silicide layer) S1 has the same composition as the silicide layer S1 formed in the source region and the drain region of the memory cell MC. However, on the upper surface of the gate electrode G1, no silicide layer S2 is formed. Moreover, the low breakdown voltage MISFET (Q1) has a gate insulating film GIL formed between the gate electrode G1 and the semiconductor substrate SB (or p-type well PS2).

The gate insulating film GIL has a stacked structure configured by an insulating film IF4 and an insulating film HK formed on the insulating film IF4. The insulating film IF4 is, for example, a silicon oxide film, and the insulating film HK is, for example, an insulating material film having a dielectric constant (relative permittivity) higher than those of silicon oxide and silicon nitride, which is a so-called high-k film (high dielectric constant film). As the insulating film HK, a metal oxide film such as a hafnium oxide (HfO) film, a zirconium oxide (ZrO) film, an aluminum oxide (AlO) film, a tantalum oxide (TaO) film or a lanthanum oxide (LaO) film may be used. For example, the hafnium oxide (HfO) film is a film containing hafnium (Hf) and oxygen (O), and its composition ratio is not particularly limited. The same goes for the zirconium oxide (ZrO) film, the aluminum oxide (AlO) film, the tantalum oxide (TaO) film or the lanthanum oxide (LaO) film.

On the gate insulating film GIL, a gate electrode G1 is formed via a metal film TN. The metal film TN is a film for use in adjusting the threshold voltage of the low breakdown voltage MISFET (Q1). As the metal film TN, for example, a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a titanium (Ti) film, a tantalum (Ta) film, a titanium aluminum (TiAl) film, an aluminum (Al) film or others can be used.

The gate electrode G1 is made of a metal film. The metal film means a conductive film having metal conductivity, and is not only a single metal film (pure metal film) or an alloy film but also includes a metal compound film having metal conductivity. As a preferable example, a titanium aluminum (TiAl) film can selected as the metal film TN, and an aluminum (Al) film can be selected as the gate electrode G1 on the metal film TN.

The extension region EX and the diffusion region DF are semiconductor regions functioning as a source region or a drain region. Each of the extension region EX and the diffusion region DF is made of a semiconductor region to which an n-type impurity is introduced, and both of them form an LDD structure. The diffusion region DF has a concentration higher than that of the extension region EX, and also has a large junction depth relative to the well region PW2. The paired extension region EX and the diffusion region DF are disposed on both ends of the gate electrode G1 so as to sandwich the gate electrode G1 therebetween. However, the extension regions EX are disposed between one of the diffusion regions DF and the gate electrode G1 and between the other diffusion region DF and the gate electrode G1.

The above-described silicide layer S1 is formed on the diffusion region DF, that is, on the upper surface (surface) of the diffusion region DF. On the sidewalls of the gate electrode G1, a sidewall spacer SW made of an insulating film such as a silicon oxide film, a silicon nitride film or a stacked film of these films is formed. Note that they are sometimes referred to as the source region or the drain region so as to include the extension region EX, the diffusion region DF and the silicide layer S1.

Next, the configuration of an n-channel-type high breakdown voltage MISFET (Q2) formed in the peripheral circuit region 1C will be described.

In the peripheral circuit region 1C, the semiconductor device has an active region and an element isolation region ST formed on the main surface of the semiconductor substrate SB. The structure and the functions of the element isolation region ST are as described above. The active region is defined, that is, partitioned by the element isolation region ST, is electrically isolated from other active region in the peripheral circuit region 1C by the element isolation region ST, and a p-type well PW3 having a p-conductivity type is formed in the active region. As described above, the p-type well PW1 is surrounded by an n-type well not shown, and therefore, is electrically isolated from the p-type well PW3. That is, a potential different from that of the p-type well PW3 can be applied to the p-type well PW1.

As shown in FIG. 1, the high breakdown voltage MISFET (Q2), which is formed in the peripheral circuit region 1C, has an n-type extension region (n$^-$-type semiconductor region, low concentration region, impurity diffusion region) EX and an n-type diffusion region (n$^+$-type semiconductor region, high concentration region, impurity diffusion region) DF that are formed inside the p-type well PW3 and serve as the gate electrode G2 and the source region or the drain region. Moreover, the high breakdown voltage MISFET (Q2) has the silicide layer (SD silicide layer) S1 formed on the upper surface of the diffusion region DF, and has the silicide layer (gate silicide layer) S2 formed on the upper surface of the gate electrode G2. The silicide layers S1 and S2 are the same as the above-described silicide layers S1 and S2.

Furthermore, the high breakdown voltage MISFET (Q2) has a gate insulating film GIH formed between the gate electrode G2 and the semiconductor substrate SB (or p-type well PW3).

More preferably, by making the gate length of the gate electrode G2 of the high breakdown voltage MISFET (Q2) to be larger (longer) than the gate length of the gate electrode G1 of the low breakdown voltage MISFET (Q1), the breakdown voltage between the source region and the drain region can be improved. Note that the gate length means a length of the gate electrode in a direction connecting the source region and the drain region with each other. That is, the length is the length of the gate electrode in a lateral direction of the drawing sheet of FIG. 1.

The gate insulating film GIH is made of an insulating film IF1. The insulating film IF1 is made of a silicon oxide film, a silicon nitride film or a silicon oxynitride film, and more preferably, is thicker than the gate insulating film GIt. Moreover, a thickness of the insulating film IF1 is preferably larger than that of the gate insulating film GIL of the low breakdown voltage MISFET (Q1) in equivalent oxide thickness, and more preferably, thicker than at least the insulating film IF4.

A gate electrode G2 is disposed on the gate insulating film GIH, and the gate electrode G2 is made of the above-described silicon film PS1. Moreover, on the upper surface of the gate electrode G2, the above-described silicide layer S2 is formed.

The source region and drain region of the high breakdown voltage MISFET (Q2) have the LDD structure configured by an extension region EX and a diffusion region DF as similar to the low breakdown voltage MISFET (Q1). However, more preferably, the impurity concentration of the extension region EX of the high breakdown voltage MISFET (Q2) may be lower than the impurity concentration of the extension region EX of the low breakdown voltage MISFET (Q1).

The silicide layer S1 formed on the upper surface of the diffusion region DF of the high breakdown voltage MISFET (Q2) is the same as the silicide layer S1 formed on the upper surface of the diffusion region DF of the low breakdown voltage MISFET (Q1) and the memory cell MC. Moreover, the silicide layer S2 formed on the upper surface of the gate electrode G2 of the high breakdown voltage MISFET (Q2) is the same as the silicide layer S2 formed on the upper surface of the control gate electrode CG and the memory gate electrode MG of the memory cell MC.

Moreover, in the present embodiment, since the channel direction (that is, a direction from the source region toward the drain region) of the high breakdown voltage MISFET (Q2) is set to a <110> or <100> direction, whisker defects which expands the silicide layer S1 formed on the upper surface of the diffusion region DF in the channel direction tends to easily occur. However, since platinum (Pt) is contained in the silicide layer S1, the occurrence of the whisker defects can be prevented.

On the sidewalls of the gate electrode G2, a sidewall spacer SW made of an insulating film such as a silicon oxide film, a silicon nitride film or a stacked film of these films is formed. Note that they are sometimes referred to as the source region or the drain region so as to include the extension region EX, the diffusion region DF and the silicide layer S1.

Next, configurations on the memory cell MC formed in the memory cell region 1A, on the low breakdown voltage MISFET (Q1) formed in the peripheral circuit region 1B and on the high breakdown voltage MISFET (Q2) formed in the peripheral circuit region 1C, will be specifically explained.

On the semiconductor substrate SB, a stacked film of an insulating film IF7 and an interlayer insulating film IL1 is formed so as to fill gaps between the control gate electrode CG and the memory gate electrode MG of the memory cell MC and between the gate electrode G1 of the low breakdown voltage MISFET (Q1) and the gate electrode G2 of the high breakdown voltage MISFET (Q2). Based on the main surface of the semiconductor substrate SB as a reference, the upper surface of the stacked film of the insulating film IF7 and the interlayer insulating film IL1 has almost the same height as the upper surfaces of the control gate electrode CG, the memory gate electrode MG and the gate electrodes G1 and G2. The insulating film IF7 is made of, for example, a silicon nitride film, and the interlayer insulating film IL1 is made of, for example, a silicon oxide film.

On the interlayer insulating film IL1, an interlayer insulating film IL2 made of, for example, a silicon oxide film is formed. In the peripheral circuit region 1B, an insulating film IF9 made of a silicon oxide film is interposed between the interlayer insulating film IL1 and the interlayer insulating film IL2.

In the memory cell region 1A and the peripheral circuit regions 1B and 1C, contact holes each of which exposes, for example, a part of the silicide layer S1 on the surface of the diffusion region DF are formed in the insulating film IF7, the interlayer insulating film IL1 and the interlayer insulating film IL2, and a conductive contact plug CP is formed inside each of the contact holes. The contact plug CP is configured by a main conductor made of tungsten (W) or others and a barrier conductor film (for example, a titanium film, a titanium nitride film or a stacked film of these films), and the barrier conductor film is interposed between the main conductor and the silicide layer S1. Moreover, in the peripheral circuit region 1B, the contact hole also penetrates the insulating film IF9.

A wiring layer M1 serving as a first layer is disposed on each of the contact plugs CP, and the wiring layer M1 is connected to the silicide layer S1 via the contact plug CP. That is, the wiring layer M1 is electrically connected to the diffusion region DF. The wiring layer M1 is formed by a conductor film containing, for example, aluminum (Al) or copper (Cu) as a main conductor.

<Characteristics and Effects of Semiconductor Device of Present Embodiment>

In the present embodiment, it is important to make a concentration (content) of an additive contained in the silicide layer S1 formed on the upper surface of the diffusion region DF to be higher than a concentration (content) of an additive contained in the silicide layer S2 formed on the upper surfaces of the control gate electrode CG, the memory gate electrode MG and the gate electrode G2. By making the concentration of the additive contained in the silicide layer S1 to be higher, the abnormal growth of the silicide layer S1 to be formed on the upper surface of the diffusion region DF can be prevented, so that a leak current between the source region or the drain region and the well regions PW1, PW2 and PW3 can be reduced. In other words, this is effective for reducing the power consumption of the semiconductor device.

If the additive having the same concentration as that of the silicide layer S1 is contained in the silicide layer S2, the resistance of the gate electrode including the silicide layer S2 is increased by the increase in the sheet resistance of the silicide layer S2, and therefore, the high-speed operation is prevented. Since crystal grains of a silicide layer having a high additive concentration are miniaturized, a possibility of grain-boundary scattering of the electric current (electrons) flowing through the silicide layer becomes higher. Moreover, because the additive is contained, the possibility of the electron scattering becomes higher. It is considered that the sheet resistance of the silicide layer is increased because of these factors. In other words, in the present embodiment, since the concentration of the additive contained in the silicide layer S2 is lower than the concentration of the additive contained in the silicide layer S1, the crystal grain size of the silicide layer S2 can be made larger than the crystal grain size of the silicide layer S1. This manner has such a feature as reducing the sheet resistance of the silicide layer S2. That is, this manner is effective for operating the MISFET at the high speed because of the reduction of the resistance of the gate electrode of the MISFET.

According to the present embodiment, by reducing the concentration of the additive in the silicide layer S2 to be lower than the concentration of the additive in the silicide layer S1, the sheet resistance of the silicide layer S2 can be reduced. Particularly, the control gate electrode CG or the memory gate electrode MG of the memory cell MC is also used as a common wiring for a plurality of memory cells MC, and therefore, the length of each of the control gate electrode CG and the memory gate electrode MG in the gate width direction becomes longer than that of the low breakdown voltage MISFET (Q1) formed in the peripheral circuit region 1B. For this reason, the reduction in the resistance of the silicide layer S2 on the upper surface of the control gate electrode CG or the memory gate electrode MG is effective for operating the nonvolatile memory at the high speed.

Here, the concentration of the additive contained in each of the silicide layers S1 and S2 means, for example, a concentration thereof per unit area of the surface of each of the silicide layers S1 and S2. Moreover, relative comparison in a content rate between the first metal (for example, Ni) and the second metal (for example, Pt) that is an additive contained in the silicide layers S1 and S2 containing silicon can be made by, for example, an energy dispersive X-ray spectroscopy (EDX) method. For example, the element analysis and composition analysis of the silicide layers S1 and S2 can be executed by detecting the characteristic X-ray caused by irradiating the surface (upper surface) of each of the silicide layers S1 and S2 with an electron beam, and performing the spectroscopy based on energy.

In the present embodiment, each of the control gate electrode CG and the memory gate electrode MG forming the memory cell MC is configured by a polysilicon film and a silicide layer S2 formed on the surface (upper surface) of the polysilicon film, and the control gate electrode CG and the memory gate electrode MG are isolated from each other by a gate insulating film GIm. By forming such a configuration, the wiring resistance of the control gate electrode CG and the memory gate electrode MG can be reduced without short-circuit between the control gate electrode CG and the memory gate electrode MG. For example, when the technique of full silicide gate of Patent Document 2 is applied to the control gate electrode CG and memory gate electrode MG, there is a problem of the short circuit between the control gate electrode CG and the memory gate electrode MG in the silicidation process of the control gate electrode CG and the memory gate electrode MG. That is, it is difficult to apply the technique of the full silicide gate of Patent Document 2 to the split gate type nonvolatile memory of the present embodiment.

<Method for Manufacturing Semiconductor Device>

A method for manufacturing the semiconductor device of the present embodiment will be described with reference to FIGS. 2 to 20.

FIGS. 2 to 20 are cross-sectional views during manufacturing processes of the semiconductor device of the present embodiment. Each cross-sectional view of FIGS. 2 to 20 corresponds to the cross-sectional view of FIG. 1. The memory cell region 1A is shown on the left side in each of the drawings, the peripheral circuit region 1B is shown at the center therein, and the peripheral circuit region 1C is shown on the right side therein. The drawings show the formation of the memory cell MC of the nonvolatile memory in the memory cell region 1A and the formation of the low breakdown voltage MISFET (Q1) and the high breakdown voltage MISFET (Q2) in the peripheral circuit regions 1B and 1C, respectively.

Figure 2:
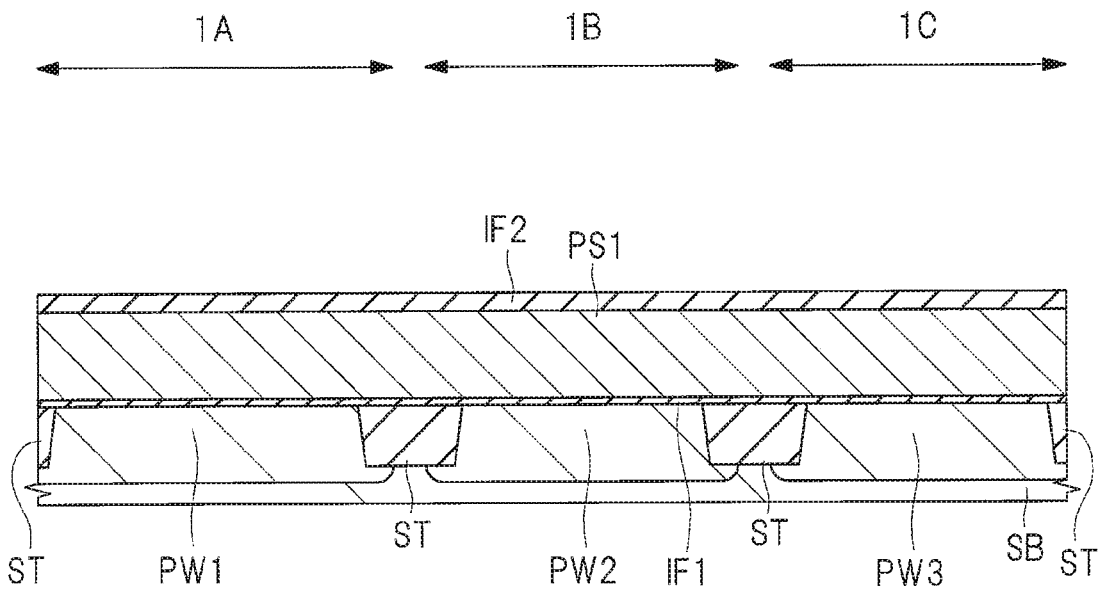

In the manufacturing processes of the semiconductor device, first, a semiconductor substrate (semiconductor wafer) SB made of a p-type single crystal silicon (Si) or others is prepared as shown in FIG. 2. Then, on the main surface of the semiconductor substrate SB, a plurality of element isolation regions ST for defining the active regions are formed.

Each of the element isolation regions ST is made of an insulator such as silicon oxide, and can be formed by using, for example, an STI method, an LOCOS method or others. Here, the formation of the element isolation regions by using the STI method will be described.

In other words, after stacking a silicon oxide film and a silicon nitride film on the semiconductor substrate SB in this order, the silicon nitride film and the silicon oxide film are etched by using a photolithography technique and a dry etching method so that patterned silicon nitride film and silicon oxide film that selectively cover the active regions are formed. Moreover, trenches are formed on the upper surface of the semiconductor substrate SB exposed from the patterned silicon nitride film and silicon oxide film. A plurality of the trenches are formed.

Subsequently, after burying an insulating film made of, for example, silicon oxide into the trenches, the respective insulating films on the silicon nitride film are removed by a polishing process or others, so that a plurality of element isolation regions ST are formed. The element isolation regions ST are formed so as to surround the active region, and are formed among the memory cell region 1A, the peripheral circuit region 1B and the peripheral circuit region 1C. Thus, a configuration shown in FIG. 2 is obtained.

Next, p-type wells PW1, PW2 and PW3 are formed on the main surface of the semiconductor substrate SB in the memory cell region 1A, the peripheral circuit region 1B and the peripheral circuit region 1C. The p-type wells PW1, PW2 and PW3 can be formed by ion-implanting a p-type impurity such as boron (B) to the semiconductor substrate SB. Note that the p-type wells PW1, PW2 and PW3 to be formed in the respective formation regions of the memory cell MC, the high breakdown voltage MISFET (Q2), the low breakdown voltage MISFET (Q1) or others can be formed by using the same ion-implanting process. However, for optimizing the characteristics of the respective elements, they can be also formed in the respective regions by using different ion-implanting processes. For example, the concentration of the p-type well PW3 in the peripheral circuit region 1C is preferably set to be higher than the concentration of the p-type well PW2 in the peripheral circuit region 1B.

Next, as shown in FIG. 2, on the main surface of the semiconductor substrate SB, an insulating film IF1 for the gate insulating film is formed. That is, the insulating film IF1 is formed on the upper surface (surface) of the semiconductor substrate SB in the memory cell region 1A and the peripheral circuit regions 1B and 1C. As the insulating film IF1, for example, a silicon oxide film can be used. The respective insulating films IF1 in the memory cell region 1A and the peripheral circuit regions 1B and 1C may be formed by using different processes from each other so as to have different film thicknesses. More preferably, the insulating film IF1 in the peripheral circuit region 1C is made thicker than the insulating film IF1 in the memory cell region 1A.

Then, a silicon film PS1 made of a polycrystal silicon film is formed on the semiconductor substrate SB by using, for example, a CVD (Chemical Vapor Deposition) method so as to cover the upper surface of the insulating film IF1. Moreover, the silicon film PS1 can be formed as a low-resistance semiconductor film (a doped polysilicon film) by introducing an impurity at the time of film formation, by ion-implanting an impurity after the film formation, or by others. As the n-type impurity to be introduced into the silicon film PS1, for example, phosphorus (P) can be preferably used.

Then, on the silicon film PS1, an insulating film IF2 is formed by using, for example, a CVD method. The insulating film IF2 is a cap insulating film made of, for example, silicon nitride (SiN). The film thickness of the insulating film IF2 can be set in a range of, for example, about 20 to 50 nm.

Figure 3:
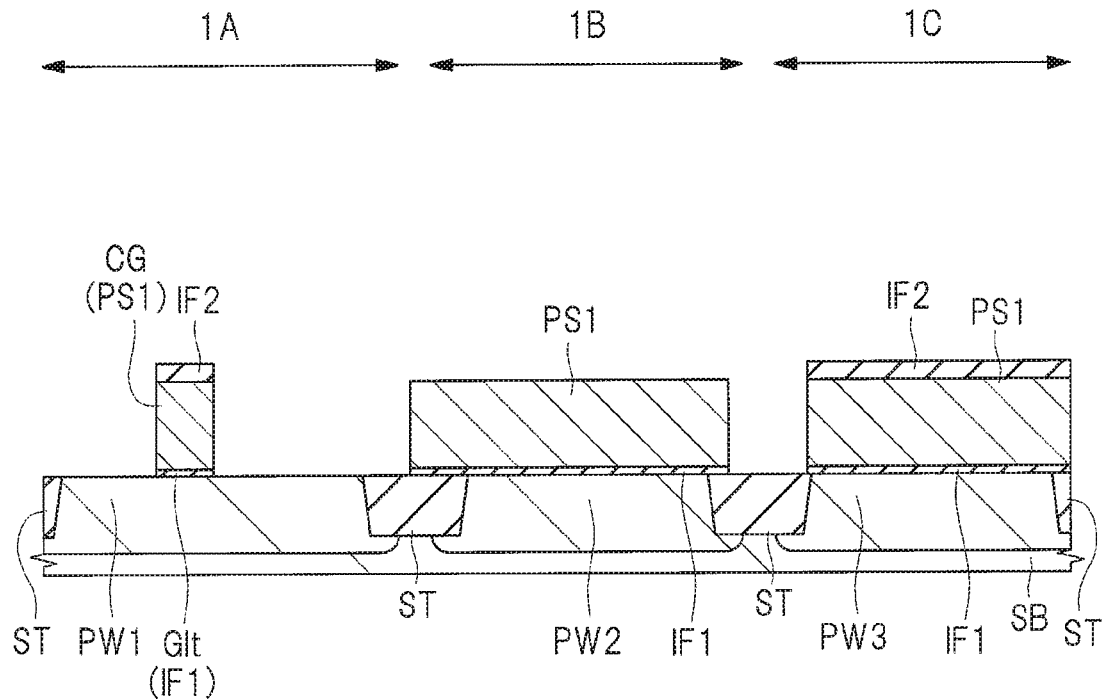

Next, as shown in FIG. 3, the stacked film, made of the insulating film IF2, the silicon film PS1 and the insulating film IF1 in the memory cell region 1A, is patterned by using a photolithography technique and an etching technique. Thus, in the memory cell region LA, a stacked body of a gate insulating film GIt made of the insulating film IF1, a control gate electrode CG made of the silicon film PS1 and a cap insulating film made of the insulating film IF2 is formed. In a plan view, the control gate electrode CG forms a pattern extending in a gate width direction. The gate width direction corresponds to a depth direction of the drawing sheet of FIG. 3.

In the above-described patterning process, the stacked film made of the insulating film IF2, the silicon film PS1 and the insulating film IF1 is processed also between the peripheral circuit regions 1B and 1C by using the photolithography technique and the etching technique. In other words, between the peripheral circuit regions 1B and 1C, the stacked bodies each made of the insulating film IF2, the silicon film PS1 and the insulating film IF1 are separated from one another, and is also separated from the stacked body made of the insulating film IF2, the silicon film PS1 and the insulating film IF1 in the memory cell region 1A. However, it is not always required to separate the insulating film IF1.

Next, as shown in FIG. 3, by using a photolithography technique and a wet etching method that are different from the patterning process of the above-described stacked film, the insulating film IF2 in the peripheral circuit region 1B is selectively removed. Thus, the upper surface of the silicon film PS1 in the peripheral circuit region 1B is exposed. At this stage, the insulating films IF2 in the memory cell region LA and the peripheral circuit region 1C are not removed but left. That is, the above-described wet-etching process is performed by using, as a mask, a resist film having a pattern that covers the memory cell region 1A and the peripheral circuit region 1C and exposes the peripheral circuit region 1B although not shown, so that the resist film not shown is removed after the above-described wet etching process.

Figure 4:
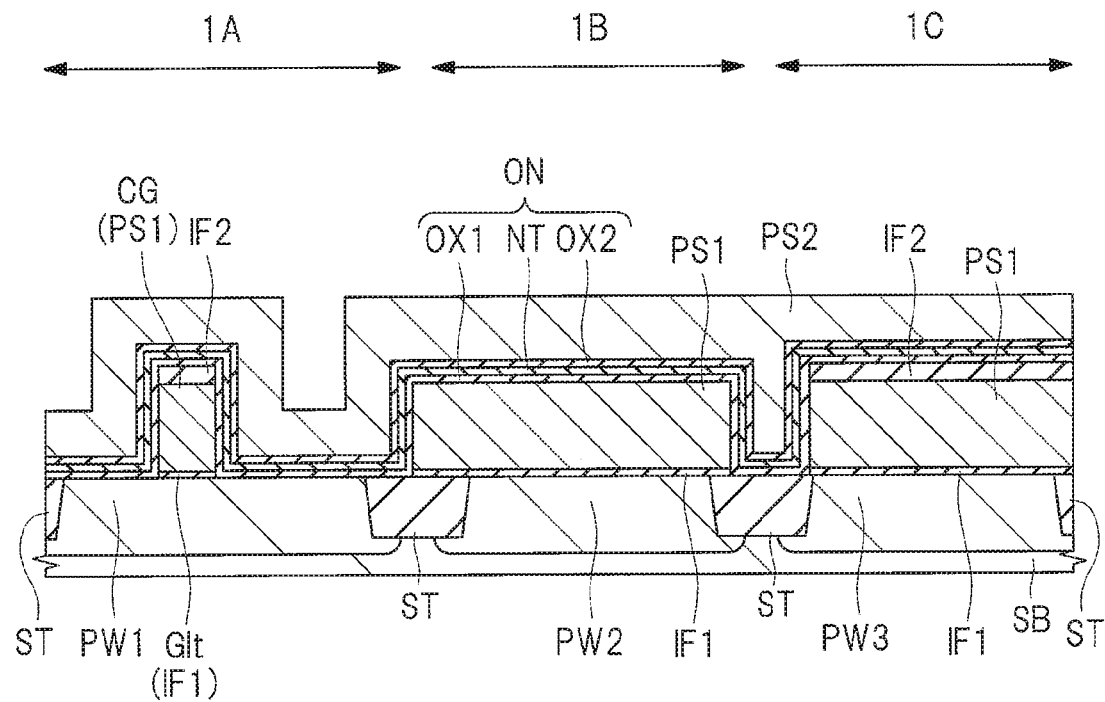
FIG. 4 is a cross-sectional view of a principal part during a manufacturing process of the semiconductor device, continued from FIG. 3.

Then, as shown in FIG. 4, an insulating film ON for forming the above-described gate insulating film GIm is formed on the main surface of the semiconductor substrate SB. The insulating film ON covers the upper surface of the semiconductor substrate SB in the memory cell region LA and the sidewalls and the upper surface of a stacked body made of the gate insulating film GIt, the control gate electrode CG and the insulating film IF2. Moreover, it also covers the sidewalls and the upper surface of the stacked body including the insulating film IF1 and the silicon film PS1 in the peripheral circuit region 1B, and further covers the sidewalls and the upper surface of the stacked body including the insulating film IF1, the silicon film PS1 and the insulating film IF2 in the peripheral circuit region 1C.

The insulating film ON is an insulating film having a charge storage portion therein. More specifically, the insulating film ON is made of a stacked film configured by a silicon oxide film OX1 formed on the semiconductor substrate SB, a silicon nitride film NT formed on the silicon oxide film OX1 and a silicon oxide film OX2 formed on the silicon nitride film NT.

The silicon oxide films OX1 and OX2 can be formed by, for example, an oxidation treatment (thermal oxidation treatment), a CVD method, or a combination of them. Particularly, for forming the silicon oxide film OX2, an ISSG (In-Situ Steam Generation) oxidation treatment can be also used. The silicon nitride film NT can be formed by, for example, a CVD method.

In the present embodiment, the memory cell is formed, and the silicon nitride film NT is formed as an insulating film (charge storage layer) having a trap level. As a film used for the charge storage layer, a silicon nitride film is preferable from the viewpoint of reliability or others. However, the film is not limited to the silicon nitride film, and a high dielectric constant film (high dielectric constant insulating film) such as an aluminum oxide film (alumina), a hafnium oxide film, a tantalum oxide film having a dielectric constant higher than that of the silicon nitride film may be used as the charge storage layer or the charge storage portion.

The thickness of the silicon oxide film OX1 can be set in a range of, for example, about 2 to 10 nm, the thickness of the silicon nitride film NT can be set in a range of, for example, about 5 to 15 nm, and the thickness of the silicon oxide film OX2 can be set in a range of, for example, about 2 to 10 nm.

Subsequently, a polycrystal silicon film PS2 is formed on the main surface of the semiconductor substrate SB so as to cover the surface of the insulating film ON by using, for example, a CVD method. Thus, the upper surface of the insulating film ON in the memory cell region 1A is covered with the silicon film PS2. That is, on the sidewalls of the control gate electrode CG, the silicon film PS2 is formed via the insulating film ON.

The film thickness of the silicon film PS2 is, for example, 40 nm. After the silicon film PS2 is formed as an amorphous silicon film at the time of the film formation, this silicon film PS2 can be changed to the silicon film PS2 made of a polycrystal silicon film by a subsequent thermal treatment. The silicon film PS2 is a film to which, for example, a p-type impurity (for example, boron (B)) is introduced at a comparatively high concentration. The silicon film PS2 is a film for use in forming the memory gate electrode MG.

The film thickness described here means a thickness of the film in a direction perpendicular to the main surface of the semiconductor substrate SB.

Note that FIG. 4 shows the insulating film ON having a stacked layer structure of three layers formed of the silicon oxide film OX1, the silicon nitride film NT and the silicon nitride film NT. However, in a cross-sectional view used for the following explanation, the illustration of the stacked layer structure of the insulating film ON is omitted in order to easily understand the drawing. That is, although the insulating film ON has the stacked layer structure, the insulating film ON is illustrated as a single film GIm in the drawings used for the following explanation.

Next, by etching back (anisotropically dry-etching) the silicon film PS2 by an anisotropic etching technique, the upper surface of the insulating film ON is selectively exposed. In this etching back process, by anisotropically etching (etching back) the silicon film PS2, the silicon film PS2 is left in a sidewall shape via the insulating film ON on both of sidewalls of the stacked body made of the gate insulating film GIt, the control gate electrode CG and the insulating film IF2.

Thus, in the memory cell region 1A, a memory gate electrode MG made of the sidewall-shaped silicon film PS2 that is left via the insulating film ON is formed on one sidewall of the sidewalls of the above-described stacked body. Moreover, by the above-described etching back process, the upper surface of the insulating film ON in each of the peripheral circuit regions 1B and 1C is exposed.

Subsequently, by using a photolithography technique, a resist film (not shown) is formed on the semiconductor substrate SB so as to cover the memory gate electrode MG adjacent to one sidewall of the control gate electrode CG and so as to expose the silicon film PS2 adjacent to the other sidewall of the control gate electrode CG. Then, by performing an etching process while using the resist film as an etching mask, the silicon film PS2 formed on the opposite side of the memory gate electrode MG across the control gate electrode CG is removed. Then, the resist film is removed. In this etching process, the memory gate electrode MG is covered with the resist film, and therefore, is not etched but left.

Subsequently, a part of the insulating film ON, the part being not covered with the memory gate electrode MG but exposed, is removed by etching (for example, wet etching). At this stage, in the memory cell region 1A, the insulating film ON right below the memory gate electrode MG is not removed but left. Similarly, the insulating film ON located between the memory gate electrode MG and the stacked body including the gate insulating film GIt, the control gate electrode CG and the insulating film IF2 is not removed but left. Since the insulating films ON in the other regions are removed, the upper surface of the semiconductor substrate SB and the upper surface of the insulating film IF2 in the memory cell region 1A are exposed, and the upper surface of the silicon film PS1 in the peripheral circuit region 1B and the upper surface of the insulating film IF2 in the peripheral circuit region 1C are further exposed. Moreover, one sidewall of the sidewalls of the control gate electrode CG, the sidewall being not adjacent to the memory gate electrode MG, is exposed.

Figure 5:
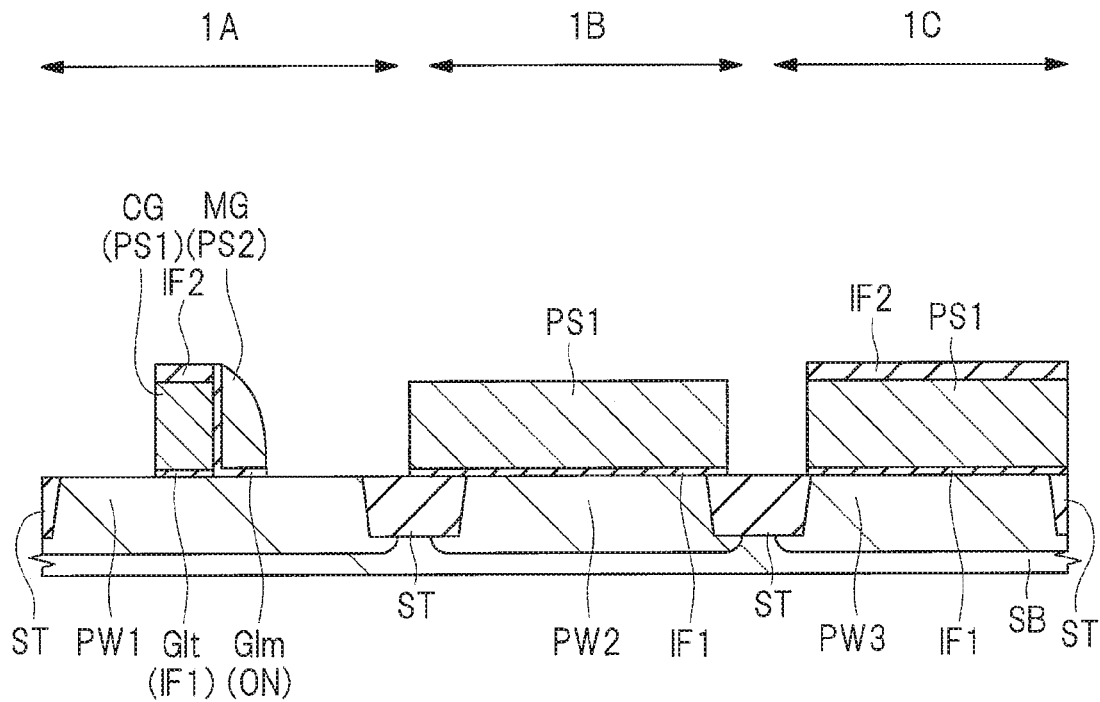
FIG. 5 is a cross-sectional view of a principal part during a manufacturing process of the semiconductor device, continued from FIG. 4.

In this manner, as shown in FIG. 5, the gate insulating film GIm made of the insulating film ON having the charge storage portion therein and the memory gate electrode MG on the gate insulating film GIm are formed on the semiconductor substrate SB so as to be adjacent to the control gate electrode CG.

Next, on the main surface of the semiconductor substrate SB, an insulating film IF3 is formed by using, for example, a CVD method. The insulating film IF3 is made of, for example, a silicon nitride film. Thus, the silicon film PS1 in the peripheral circuit region 1B and the silicon film PS1 and the insulating film IF2 in the peripheral circuit region 1C are covered with the insulating film IF3. Moreover, the stacked body made of the gate insulating film GIt in the memory cell region 1A, the control gate electrode CG and the insulating film IF2, the gate insulating film GIm and the memory gate electrode MG adjacent to the sidewalls of the stacked body, and the main surface of the semiconductor substrate SB in the memory cell region 1A are covered with the insulating film IF3. Note that the insulating film IF3 may be formed as a stacked film of a silicon oxide film and a silicon nitride film on the silicon oxide film.

Figure 6:
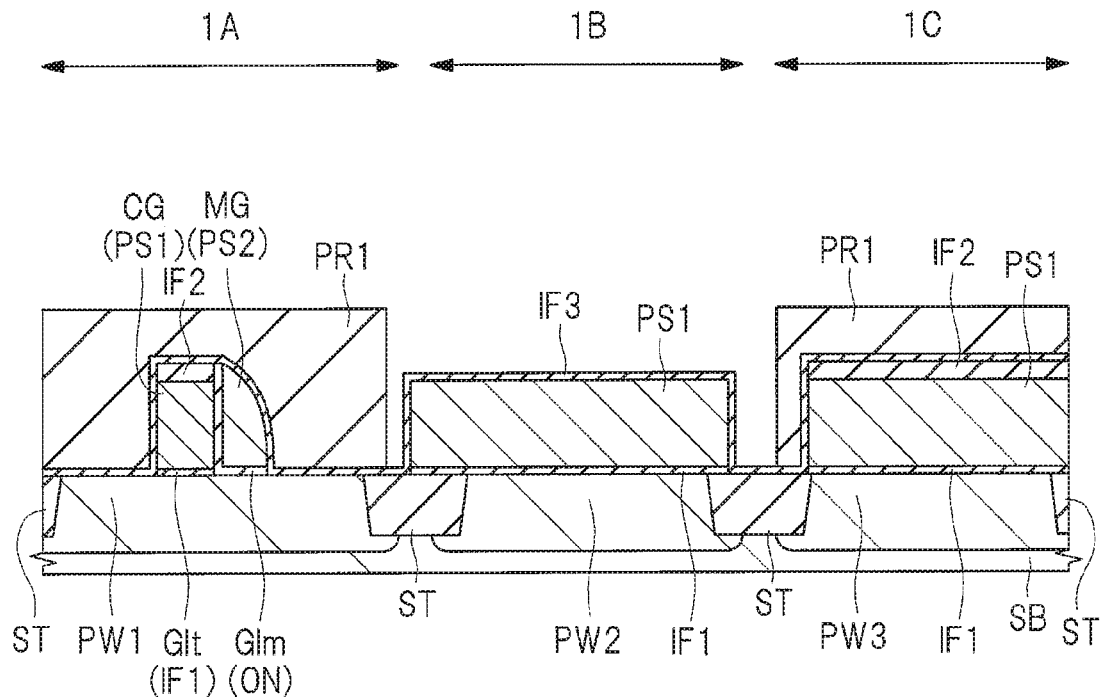
FIG. 6 is a cross-sectional view of a principal part during a manufacturing process of the semiconductor device, continued from FIG. 5.

Subsequently, as shown in FIG. 6, by using a photolithography technique, the peripheral circuit region 1C is exposed, and a resist film PR1 that covers the insulating films IF3 in the memory cell region 1A and the peripheral circuit region 1C is formed. In the peripheral circuit region 1B, note that each insulating film IF3 adjacent to the upper surface and the sidewalls of the silicon film PS1 is exposed from the resist film PR1.

Next, the insulating film IF3 exposed from the resist film PR1 is removed by a wet etching method, and then, the resist film PR1 is removed. Thus, the silicon film PS1 in the peripheral circuit region 1B is exposed.

Figure 7:
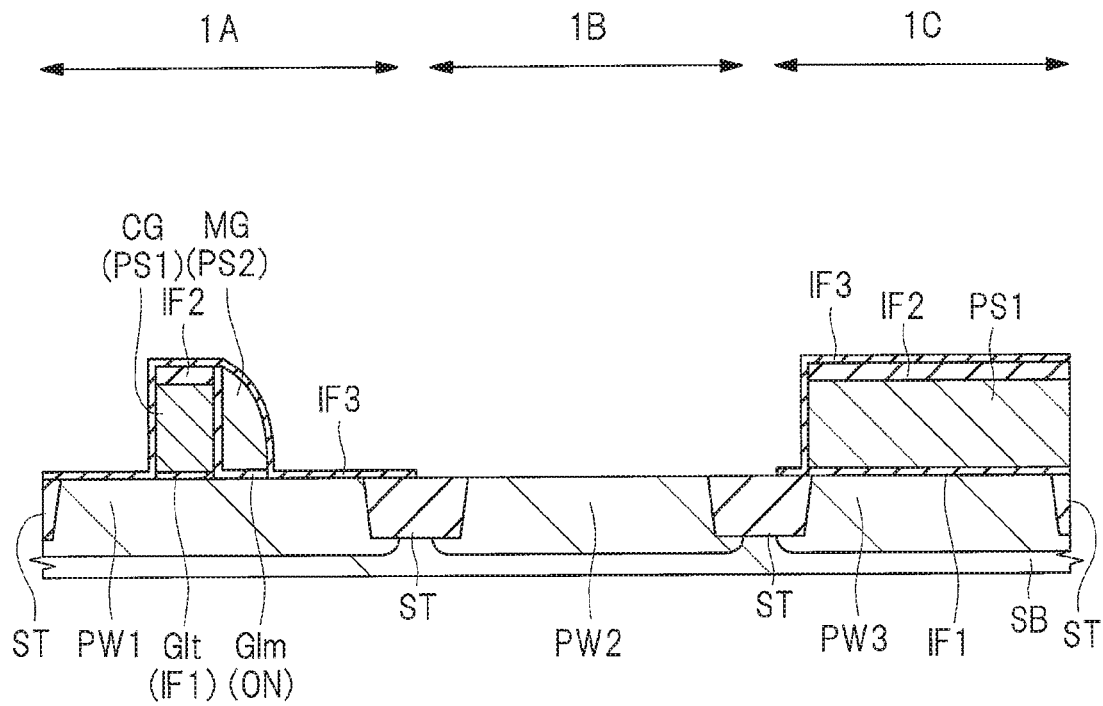
FIG. 7 is a cross-sectional view of a principal part during a manufacturing process of the semiconductor device, continued from FIG. 6.

Then, as shown in FIG. 7, the main surface of the semiconductor substrate SB is exposed by removing the silicon film PS1 and the insulating film IF1 in the peripheral circuit region 1B by using, for example, a wet etching method while using the insulating film IF3 as a mask. At this stage, the stacked body configured by the gate insulating film GIt, the control gate electrode CG and the insulating film IF2, and the gate insulating film GIm in the memory cell region 1A and the memory gate electrode MG that are adjacent to the sidewalls of the stacked body are covered with the insulating film IF3, and therefore, are not removed. Moreover, the insulating film IF2, the silicon film PS1 and the insulating film IF1 in the peripheral circuit region 1C are covered with the insulating film IF3, and therefore, are not removed.

Figure 8:
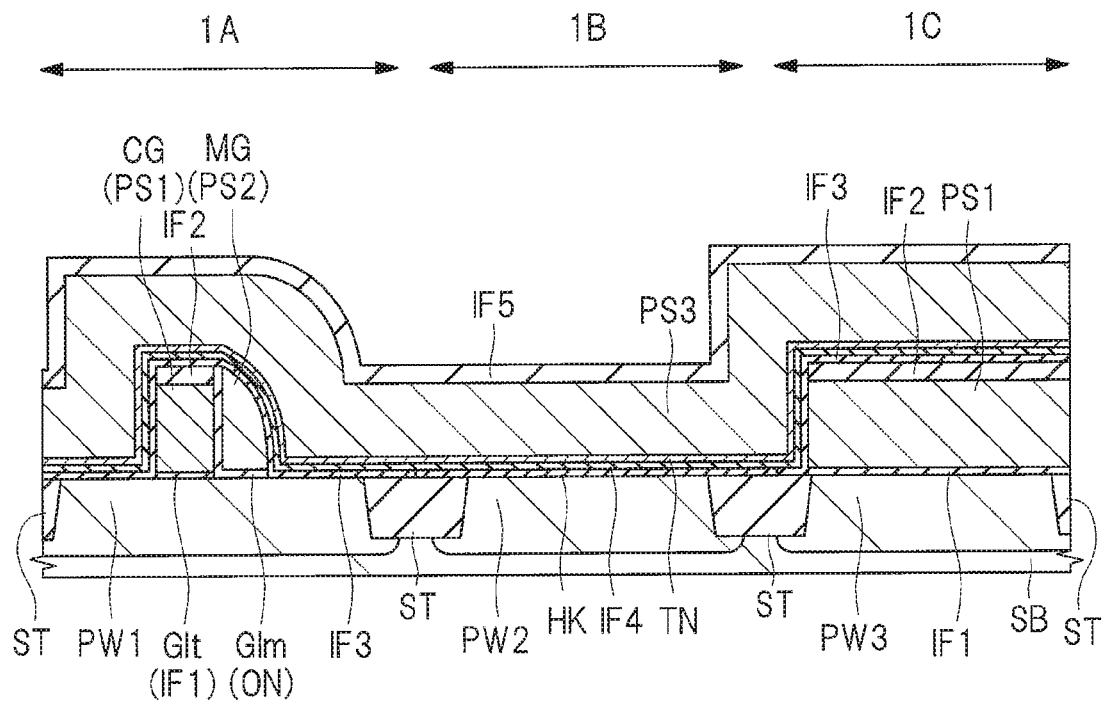
FIG. 8 is a cross-sectional view of a principal part during a manufacturing process of the semiconductor device, continued from FIG. 7.

Next, as shown in FIG. 8, insulating films IF4 and HK, a metal film TN, a silicon film PS3 and an insulating film IF5 are sequentially formed on the main surface of the semiconductor substrate SB. However, the insulating film IF4 is made of, for example, a silicon oxide film, and is formed by using an oxidizing method such as a thermal oxidizing method, and therefore, the insulating film IF4 is formed only on the main surface of the semiconductor substrate SB in the peripheral circuit region 1B. Thus, the stacked body configured by the gate insulating film GIt, the control gate electrode CG and the insulating film IF2 in the memory cell region 1A, and the gate insulating film GIm and the memory gate electrode MG that are adjacent to the sidewalls of the stacked body, are also covered with the insulating films IF3 and HK, the metal film TN, the silicon film PS3 and the insulating film IF5. Moreover, the stacked body configured by the insulating film IF1, the silicon film PS1 and the insulating film IF2 in the peripheral circuit region 1C are also covered with the insulating films IF3 and HK, the metal film TN, the silicon film PS3 and the insulating film IF5.

The insulating film HK is an insulating film for the gate insulating film. More specifically, the insulating film IF4 and the insulating film HK are films that configure the gate insulating film of the MISFET (Q1) to be formed later in the peripheral circuit region 1B. The insulating film HK is an insulating film having a dielectric constant (relative dielectric constant) higher than those of silicon oxide and silicon nitride, that is so called high-k film (high dielectric constant film).

As the insulating film HK, a metal oxide film such as a hafnium oxide film, a zirconium oxide film, an aluminum oxide film, a tantalum oxide film, a lanthanum oxide film or others, can be used, and these metal oxide films can further contain either one or both of nitrogen (N) and silicon (Si). The insulating film HK can be formed by, for example, an ALD (Atomic Layer Deposition) method or others. The film thickness of the insulating film HK is, for example, 1.5 nm. In the case of usage of the high dielectric constant film (here, the insulating film HK) as the gate insulating film, the physical film thickness of the gate insulating film can be larger than the case of the usage of the silicon oxide film, and therefore, the case can obtain such an advantage as reducing a leak current.

The metal film TN is made of, for example, a titanium nitride film, and can be formed by using, for example, a sputtering method. The silicon film PS3 is made of a polysilicon film, and can be formed by using, for example, a CVD method. The film thickness of the silicon film PS3 is, for example, 40 nm. After the silicon film PS3 is formed as an amorphous silicon film at the time of the film formation, this silicon film PS3 made of the amorphous silicon film can be also changed to the silicon film PS3 made of a polycrystal silicon film by a subsequent thermal treatment. The silicon film PS3 is a film for use in forming a dummy gate electrode DG described later. The insulating film IF5 is a cap insulating film made of, for example, silicon nitride, and can be formed by using, for example, a CVD method.

Figure 9:
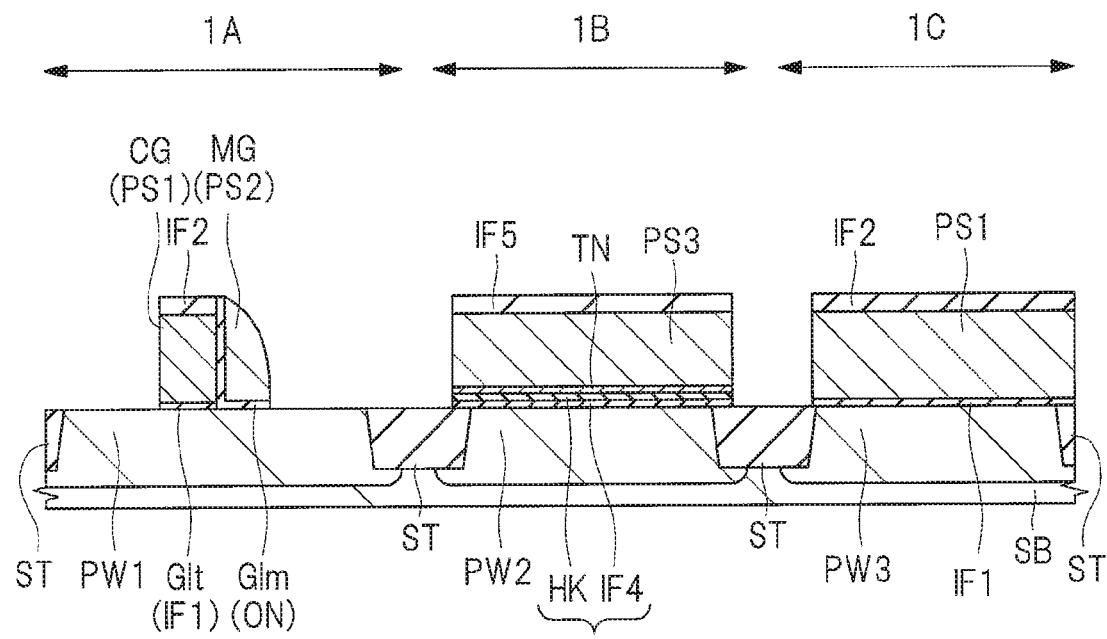
FIG. 9 is a cross-sectional view of a principal part during a manufacturing process of the semiconductor device, continued from FIG. 8.

Next, as shown in FIG. 9, insulating films IF4 and HK, a metal film TN, a silicon film PS3 and an insulating film IF5 are selectively left in the peripheral circuit region 1B. And, the insulating film IF4 and HK, the metal film TN, the silicon film PS3 and the insulating film IF5 are removed from the memory cell region 1A and the peripheral circuit region 1C by, for example, a wet etching method. In this wet etching method, the wet etching method is performed by selectively covering an upper surface of a stacked body configured by the insulating films IF4 and HK, a metal film TN, a silicon film PS3 and an insulating film IF5 in the peripheral circuit region 1B with an insulating film such as a silicon oxide film, and then, by using this insulating film as a mask.

Figure 10:
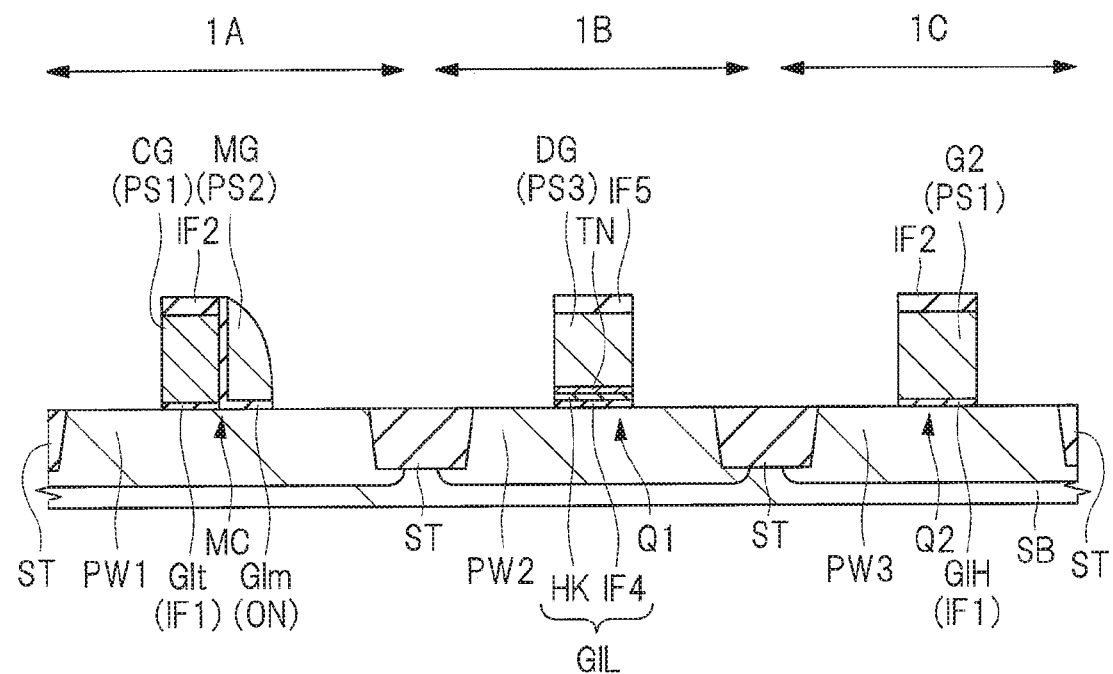
FIG. 10 is a cross-sectional view of a principal part during a manufacturing process of the semiconductor device, continued from FIG. 9.

Next, as shown in FIG. 10, the insulating film IF5, the silicon film PS3, the metal film TN, and the insulating films HK and IF4 in the peripheral circuit region 1B, and besides, the insulating film IF2, the silicon film PS1 and the insulating film IF1 in the peripheral circuit region 1C are patterned by using a photolithography technique and an etching technique. Thus, in the peripheral circuit region 1B, the dummy gate electrode DG made of the silicon film PS3, the metal film TN and a gate insulating film GIL made of the insulating films HK and IF4, which configure the MISFET (Q1), are formed. Simultaneously, in the peripheral circuit region IC, a gate electrode G2 and a gate insulating film GIH, which configure the MISFET (Q2), are formed.

Here, in a state in which the memory cell region 1A is covered with a resist film, first, the insulating film IF5 in the peripheral circuit region 1B and the insulating film IF2 in the peripheral circuit region 1C are patterned by a photolithography technique and an etching method. Then, in the peripheral circuit region 1B, the silicon film PS3, the metal film TN, and the insulating films HK, IF4 and IF1 are patterned by the etching process while using the patterned insulating film IF5 as a hard mask, so that the gate insulating film GIL configured by the dummy gate electrode DG, the metal film TN and the insulating films HK and IF4 is formed. Moreover, in the peripheral circuit region 1C, the silicon film PS1 and the insulating film IF4 are patterned by the etching process while using the patterned insulating film IF2 as a hard mask, so that the gate electrode G2 and the gate insulating film GIH are formed.

Figure 11:
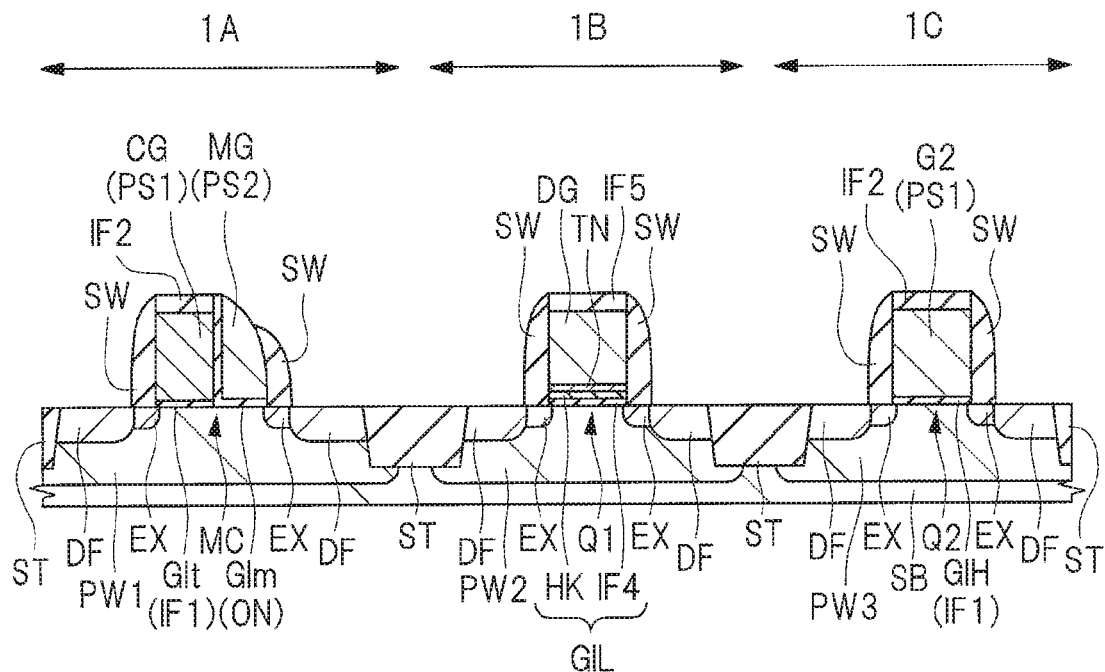
FIG. 11 is a cross-sectional view of a principal part during a manufacturing process of the semiconductor device, continued from FIG. 10.

Next, as shown in FIG. 11, a plurality of extension regions (n⁻-type semiconductor regions, impurity diffusion regions) EX are formed by using an ion implantation method or others. That is, in the active region, while an n-type impurity such as arsenic (As) or phosphorus (P) is introduced into the surface of the semiconductor substrate SB, no impurity is introduced into the lower portions of the control gate electrode CG, the memory gate electrode MG, the dummy gate electrode DG and the gate electrode G2. That is, in the active region, the extension regions EX are formed on both sides of the control gate electrode CG and memory gate electrode MG, both sides of the dummy gate electrode DG and both sides of the gate electrode G2. Prior to the formation of the extension regions EX, an offset spacer that covers each of the sidewalls of the control gate electrode CG, the memory gate electrode MG, the dummy gate electrode DG and the gate electrode G2 may be formed of, for example, a silicon nitride film, a silicon oxide film or a stacked film of these films.

The extension region EX of each of the memory cell region 1A and the peripheral circuit regions 1B and 1C can be formed by the same ion implantation method as each other. However, they can be also formed by using a different ion implantation process. Although its illustration is omitted, note that, before or after the formation process of the extension regions EX, for example, a halo region may be formed on the main surface of the semiconductor substrate SB in the peripheral circuit region 1B by implanting a p-type impurity (for example, boron (B)) while using the insulating film IF5 and the dummy gate electrode DG as a mask. The halo region is closer to the center of the dummy gate electrode DG than the extension regions EX. That is, the halo region is formed at a portion close to the channel region of the low breakdown voltage MISFET (Q1) formed in the peripheral circuit region 1B. By forming the halo region, the short channel characteristics of this MISFET can be improved. Similarly, the halo region may be formed at a portion close to the channel region of the high breakdown voltage MISFET (Q2).

Subsequently, sidewalls SW made of an insulating film covering the sidewalls on both sides of the above-described structure including the control gate electrode CG and the memory gate electrode MG in the memory cell region 1A are formed. Moreover, by this process, sidewalls SW covering the sidewalls on both sides of the stacked body configured by the gate insulating film GIL, the metal film TN, the dummy gate electrode DG and the insulating film IF5 are formed in the peripheral circuit region 1B. Furthermore, by this process, sidewalls SW covering the sidewalls on both sides of the stacked body configured by the gate insulating film GIH, the gate electrode G2 and the insulating film IF2 are formed in the peripheral circuit region 1C.

In the sidewalls SW, after sequentially forming, for example, a silicon oxide film and a silicon nitride film on the semiconductor substrate SB by using a CVD method or others, a part of the silicon oxide film and the silicon nitride film is removed by an anisotropic etching process so that the upper surface of the semiconductor substrate SB and the upper surfaces of the insulating films IF2 and IF5 are exposed. Thus, the sidewalls SW can be selectively formed on the sidewalls of the control gate electrode CG, the memory gate electrode MG, the dummy gate electrode DG and the gate electrode G2. While it is considered that the sidewalls SW are formed of a stacked film, the drawings do not show an interface between the films configuring the stacked film. The sidewalls SW may be formed of, for example, a single layer film such as a silicon oxide film or a silicon nitride film.

Subsequently, diffusion regions ($n^+$-type semiconductor regions, impurity diffusion regions) DF are formed in the memory cell region 1A and the peripheral circuit regions 1B and 1C by using an ion implantation method or others. That is, while an n-type impurity such as arsenic (As) or phosphorus (P) is introduced into the surface of the semiconductor substrate SB in the active region, no impurity is introduced into the lower portions of the control gate electrode CG, the memory gate electrode MG, the dummy gate electrode DG, the gate electrode G2 and the sidewalls SW. That is, in the active region, the diffusion regions DF are formed on both sides of the control gate electrode CG and memory gate electrode MG, both sides of the dummy gate electrode DG and both sides of the gate electrode G2, and besides, formed outside each sidewall SW. The diffusion region DF has a higher impurity concentration and a larger junction depth than those of the extension region EX.

Thus, the source region and the drain region having an LDD structure configured by the extension region EX and a diffusion region DF having an impurity concentration higher than that of the extension region EX are formed.

In the memory cell region LA, the extension region EX and the diffusion region DF formed on the upper surface of the semiconductor substrate SB so as to sandwich the control gate electrode CG and the memory gate electrode MG configure the source region and the drain region of the memory cell MC. Moreover, in the peripheral circuit region 1B, the extension region EX and the diffusion region DF formed on the upper surface of the semiconductor substrate SB so as to sandwich the dummy gate electrode DG configure the source region and the drain region of the low breakdown voltage MISFET (Q1). In the peripheral circuit region 1C, the extension region EX and the diffusion region DF formed on the upper surface of the semiconductor substrate SB so as to sandwich the gate electrode G2 configure the source region and the drain region of the high breakdown voltage MISFET (Q2). The diffusion region DF formed in each of the memory cell region 1A and the peripheral circuit regions 1B and 1C can be formed by the same ion implantation process as each other. However, these diffusion regions DF can be also formed by using different ion implantation processes from each other.

Subsequently, an activation annealing process, which is a thermal treatment for activating the impurity introduced into the semiconductor region (extension region EX and diffusion region DF) for the source and drain or others, is performed.

Next, a silicide layer is formed by performing a so-called salicide (Salicide: Self-Aligned Silicide) process which is explained with reference to FIGS. 12 and 13. More specifically, the silicide layer can be formed as follows.

Figure 12:
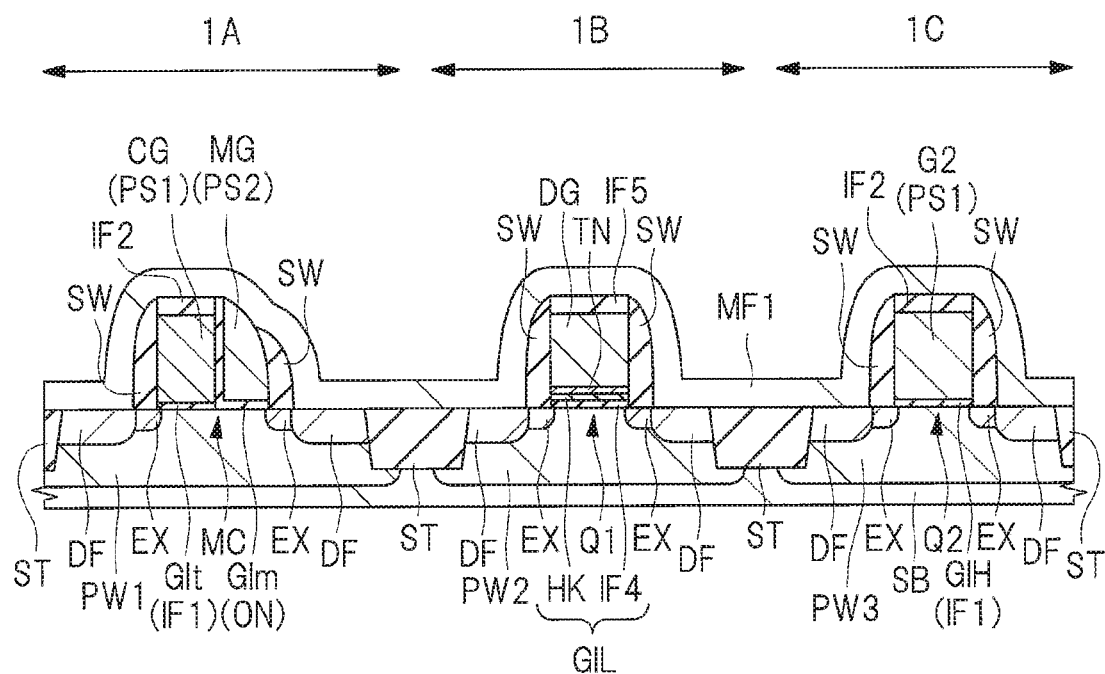
FIG. 12 is a cross-sectional view of a principal part during a manufacturing process of the semiconductor device, continued from FIG. 11.

That is, as shown in FIG. 12, by performing a chemical dry etching process onto the main surface of the semiconductor substrate SB as a pretreatment, an excessive silicon oxide film or others on the semiconductor substrate SB is removed so as to expose the surface of the semiconductor. Subsequently, a metal film MF1 for use in forming a silicide layer is formed (deposited) on the main surface of the semiconductor substrate SB including the upper surface of the diffusion region DF and the upper surface of the memory gate electrode MG. The film thickness of the metal film MF1 is set to, for example, 20 to 25 nm.

The metal film MF1 can be formed by a sputtering method using, for example, an alloy target formed by adding platinum (Pt) to nickel (Ni). The content (concentration) of platinum (Pt) that is an additive to the alloy target is set to 5% or more (more preferably, 5% or more and 10% or less). The additive may be aluminum (Al), carbon (C) or others. The content (concentration) in this case is also set to 5% or more (more preferably, 5% or more and 10% or less). However, platinum has higher heat resistance than that of aluminum, carbon or others, and therefore, can be preferably used for the alloy film. The metal film MF1 formed by the sputtering method using the alloy target is a nickel (Ni) film containing platinum (Pt), and the content of platinum (Pt) is 5% or more. Here, nickel serving as a main material is referred to as first metal, and platinum (Pt) serving as an additive is referred to as second metal.

Next, by performing a first thermal treatment onto the semiconductor substrate SB, the respective surface layer portions of the diffusion region DF and the memory gate electrode MG are allowed to react with the metal film MF1. This first thermal treatment is a thermal treatment for allowing the metal film MF1 to react with silicon of the diffusion region DF and the memory gate electrode. By the first thermal treatment, a silicide layer in which NiSi fine crystals and $Ni_2Si$ are dominant is formed on the respective upper portions of the diffusion region DF and the memory gate electrode MG. At this stage, the silicide layer is a silicide layer having comparatively high resistance which is different from the silicide layer S1 shown in FIG. 1. Moreover, since the platinum (Pt) serving as the additive has a small content, no platinum silicide is formed, so that the crystals of the silicide layer and the silicide layer S1 to be explained later are described as NiSi and $Ni_2Si$ so as not to contain Pt. Next, after the first thermal treatment, the unreacted portion of the metal film MF1 with silicon is removed by wet etching or others, and then, second thermal treatment is performed onto the semiconductor substrate SB. The second thermal treatment is executed in order to promote the crystal growth of the silicide layer having comparatively high resistance to form the silicide layer S1 having comparatively low resistance in which NiSi is dominant. The temperature of the second thermal treatment is higher than the temperature of the first thermal treatment. Thus, the silicide layer S1 made of NiSi is formed.

For the above-described two thermal treatments, for example, a thermal treatment apparatus for heating the semiconductor substrate SB by using a carbon heater is used. In the first thermal treatment, the silicide layer having comparatively high resistance is formed by, for example, the heating at a temperature of about 260° C. for 30 to 60 seconds. Then, after the unreacted part of the metal film MF1 is removed by wet etching or others as described above, the second thermal treatment is further performed at 600° C. for 10 to 30 seconds, so that the silicide layer S1 having the reduced resistance is grown. Here, by separately performing the thermal treatments as described above, such abnormal growth of the silicide layer S1 as extending inside the semiconductor substrate SB can be prevented. Moreover, in the formation of the silicide layer S1, the abnormal growth of the silicide layer S1 can be suppressed by using nickel (Ni) metal containing platinum (Pt), so that a leak current in the diffusion region DF (in other words, the source region or the drain region) can be reduced.

Here, the second thermal treatment is performed at, for example, a temperature of 450° C. or higher and 600° C. or lower. In the present embodiment, as described above, the second thermal treatment is performed at 600° C. Note that the second thermal treatment may be performed by using a laser, microwaves or a flash lamp.

In this manner, since the second thermal treatment is performed at a very high temperature, the silicide layer S1 formed by the thermal treatment has a comparatively high tensile stress. By application of this tensile stress to the memory cell MC and channels of the low breakdown voltage MISFET (Q1) and the high breakdown voltage MISFET (Q2), the mobility of electrons or positive holes is improved, so that the memory cell MC, the low breakdown voltage MISFET (Q1) and the high breakdown voltage MISFET (Q2) can be operated at a high speed.

Note that the upper surfaces of the control gate electrode CG and the gate electrode G2 are covered with the insulating film IF2, and the upper surface of the dummy gate electrode DG is covered with the insulating film IF5, and therefore, no silicide layer S1 is formed on the upper portions of the control gate CG, the gate electrode G2 and the dummy gate electrode DG. Since the upper portion of the sidewall-shaped memory gate electrode MG is exposed, the silicide layer S1 is formed on the exposed portion. However, this silicide layer S1 is completely removed by a polishing process based on a CMP (Chemical Mechanical Polishing) method to be performed in a later process.

Figure 14:
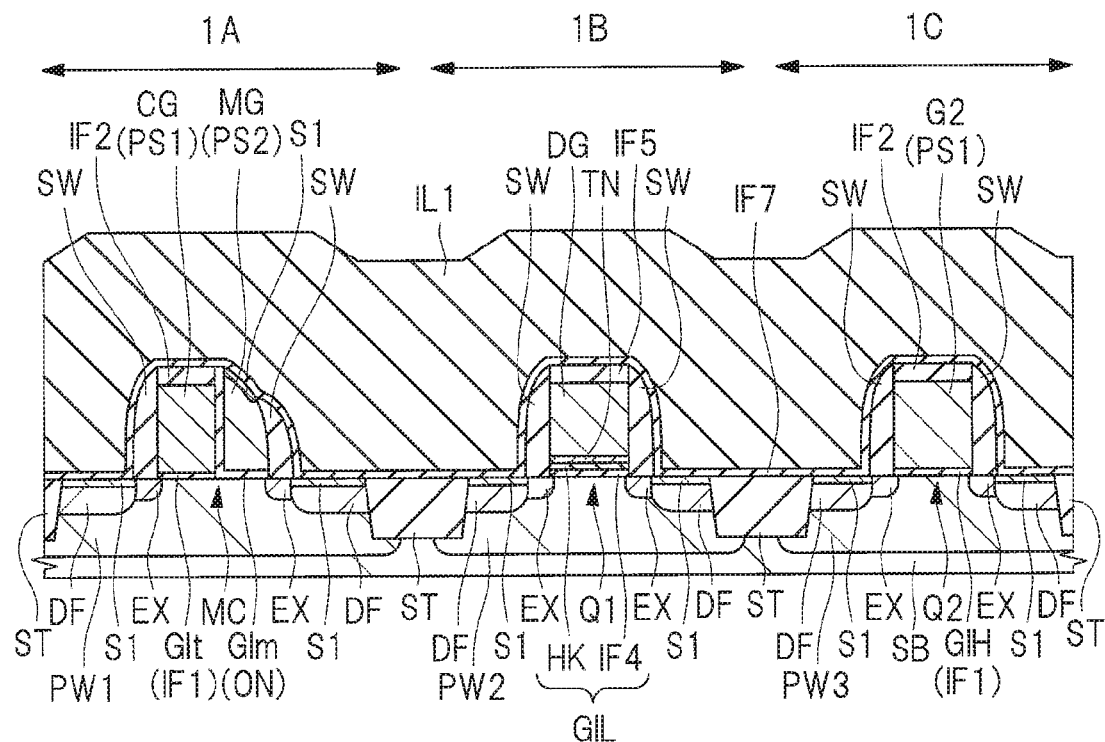
FIG. 14 is a cross-sectional view of a principal part during a manufacturing process of the semiconductor device, continued from FIG. 13.

Next, as shown in FIG. 14, on the main surface of the semiconductor substrate SB, an insulating film (liner insulating film) IF7 and an interlayer insulating film IL1 are subsequently formed so as to cover the control gate electrode CG, the memory gate electrode MG, the dummy gate electrode DG, the gate electrode G2 and the sidewalls SW. The insulating film IF7 is made of, for example, a silicon nitride film, and can be formed by, for example, a CVD method. The insulating film IF7 can be used as an etching stopper film when a contact hole is formed in a later process. The interlayer insulating film IL1 is made of, for example, a single film of a silicon oxide film, and can be formed by, for example, a CVD method or others. Here, the interlayer insulating film IL1 is formed with, for example, a film thickness larger than the film thickness of the control gate electrode CG.

Figure 15:
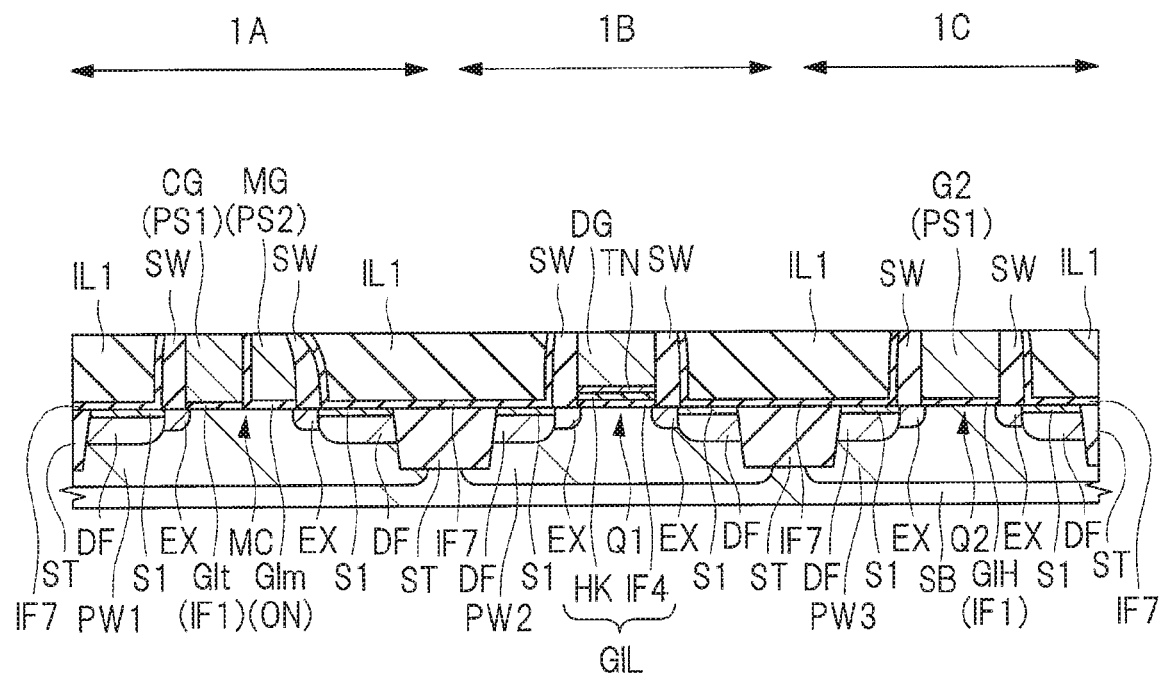
FIG. 15 is a cross-sectional view of a principal part during a manufacturing process of the semiconductor device, continued from FIG. 14.

Next, as shown in FIG. 15, the upper surface of the interlayer insulating film IL1 is polished by using a CMP method or others. In this manner, the upper surface of each of the control gate electrode CG, the memory gate electrode MG, the dummy gate electrode DG, and the gate electrode G2 is exposed. That is, in this polishing process, the interlayer insulating film IL1 and the insulating film IF7 are polished until the upper surface of each of the control gate electrode CG, the memory gate electrode MG, the dummy gate electrode DG, and the gate electrode G2 is exposed. In this manner, the insulating films IF2 and IF5 are removed, and the upper portion of each of the sidewall SW and the gate insulating film GIm is partially removed. In addition, by this process, the silicide layer S1 on the memory gate electrode MG is removed together with a part of the upper portion of the memory gate electrode MG. At this stage, since the gate insulating film GIm and the sidewalls SW or others, located between the control gate electrode CG and the memory gate electrode MG, are polished all together, the heights of the gate insulating film GIm and the sidewalls SW are almost equal to the height of the control gate electrode CG or the memory gate electrode MG.

Figure 16:
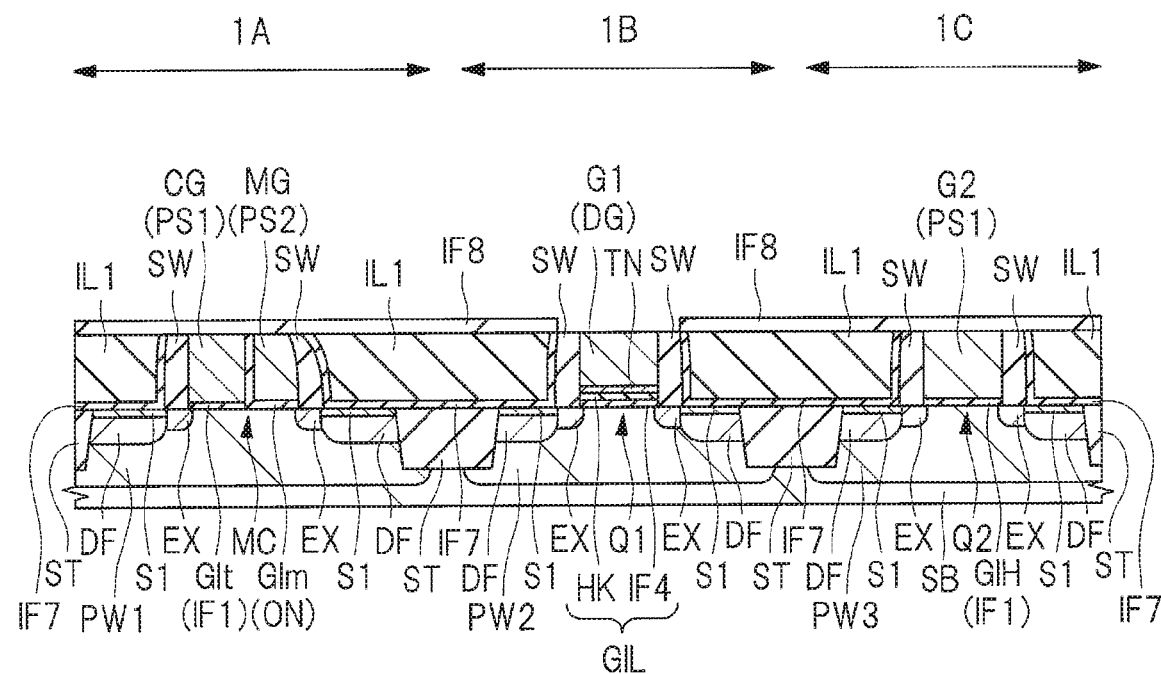
FIG. 16 is a cross-sectional view of a principal part during a manufacturing process of the semiconductor device, continued from FIG. 15.

Next, as shown in FIG. 16, after the insulating film IF8 is formed on the interlayer insulating film IL1 by using, for example, a CVD method, the insulating film IF8 is processed by using a photolithography technique and an etching method. In this manner, the insulating film IF8 covers the memory cell region LA and the peripheral circuit region 1C, and exposes the dummy gate electrode DG in the peripheral circuit region 1B. That is, the insulating film IF8 covers the upper surfaces of the control gate electrode CG, the memory gate electrode MG, and the gate electrode G2, and exposes the upper surface of the dummy gate electrode DG. The insulating film IF8 is made of, for example, a silicon oxide film.

Then, the dummy gate electrode DG is removed by a wet etching method. Here, the dummy gate electrode DG is removed by the wet etching process using, for example, alkaline aqueous solution while using the insulating film IF8 as a mask for protecting the control gate electrode CG, the memory gate electrode MG and the gate electrode G2. As the alkaline aqueous solution, for example, ammonia hydrogen peroxide mixture ($NH_4OH+H_2O_2+H_2O$) is used. By removing the dummy gate electrode DG, a trench (concave portion, hollow portion) is formed in the metal film TN. The trench on the metal film TN in the peripheral circuit region 1B is a region from which the dummy gate electrode DG is removed, and the sidewalls on both sides of the trench are formed of the sidewalls SW.

Next, as shown in FIG. 16, that is, a metal film is formed as a conductive film for the gate electrode on the semiconductor substrate SB, that is, on the interlayer insulating film IL1 including the upper portion of the inner surface (bottom surface and sidewalls) of the above-described trench so as to completely bury the trench. Note that the metal film is considered to have, for example, a stacked structure of two or more metal films. However, in the drawing, the illustration of the border between the two or more metal films is omitted, and the metal film is shown as a single film.

In the formation process of the metal film, the inside of the trench is completely filled. In addition, the metal film is also formed on the interlayer insulating film IL1. As the metal film, for example, a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a titanium (Ti) film, a tantalum (Ta) film, a titanium aluminum (TiAl) film, an aluminum (Al) film, or others can be used. Note that the term "metal film" described here means a conductive film exhibiting metallic conduction, and includes not only a single metal film (pure metal film) or an alloy film, but also a metallic compound film exhibiting the metallic conduction. The metal film can be formed by using, for example, a sputtering method or others.

Here, for example, the metal film can be formed of, for example, a stacked film of a titanium nitride (TiN) film and an aluminum (Al) film on the titanium nitride film. At this stage, it is preferable to make the aluminum film thicker than the titanium nitride film. Since the aluminum film has low resistance, the resistance of the gate electrode G1 to be formed later can be reduced.

Then, by polishing and removing the unnecessary portions of the metal film outside the trenches by a CMP method or others, the metal film is buried into the trenches. Thus, the gate electrode G1 of the low breakdown voltage MISFET (Q1) in the peripheral circuit region 1B is formed. As described above, the entire gate electrode G1 is made of a metal film, and therefore, there is no problem for, for example, a depleted gate electrode as observed in the case of the usage of the polysilicon film. Although its illustration is omitted, note that the gate electrode of the p-type low breakdown voltage MISFET in the peripheral circuit region 1B can be formed by burying a metal film different from that of the gate electrode G1 of the low breakdown voltage MISFET (Q1), by repeating the same processes as described above.

Figure 17:
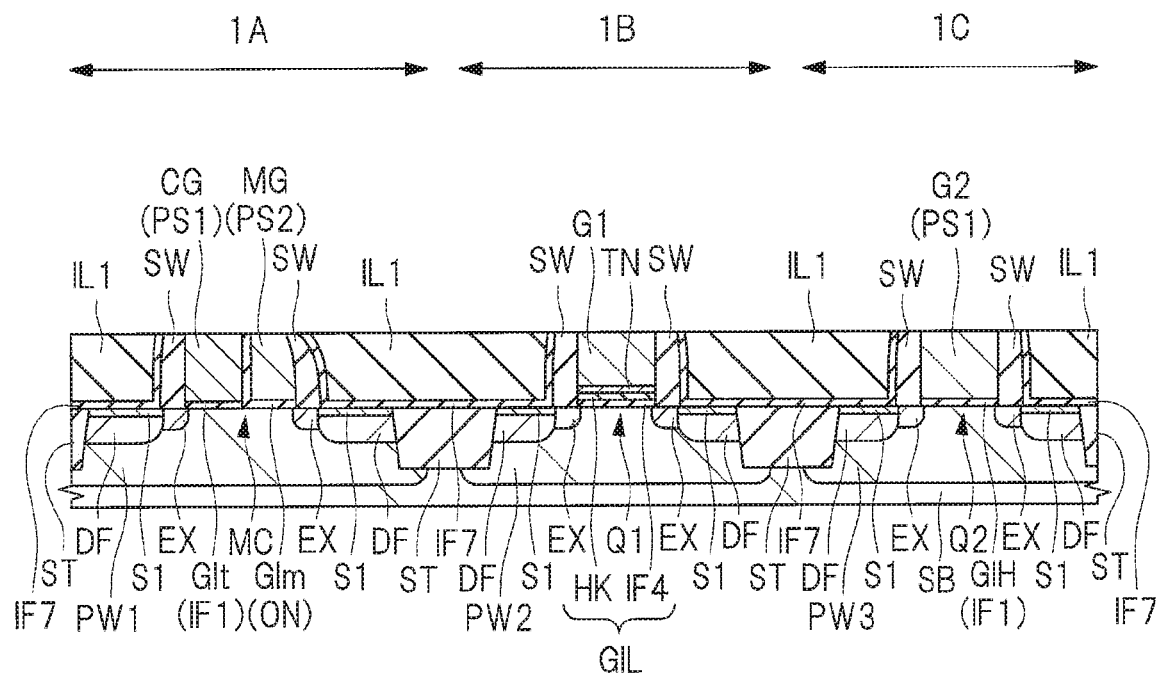
FIG. 17 is a cross-sectional view of a principal part during a manufacturing process of the semiconductor device, continued from FIG. 16.

Next, by removing the insulating film IF8 by using, for example, a wet etching method or others, the control gate electrode CG, the memory gate electrode MG and the gate electrode are exposed as shown in FIG. 17.

Next, as explained with reference to FIGS. 18 and 19, a silicide layer is formed on each of the electrodes made of a polysilicon film by performing the salicide process. More specifically, the silicide layer can be formed as follows.

Figure 18:
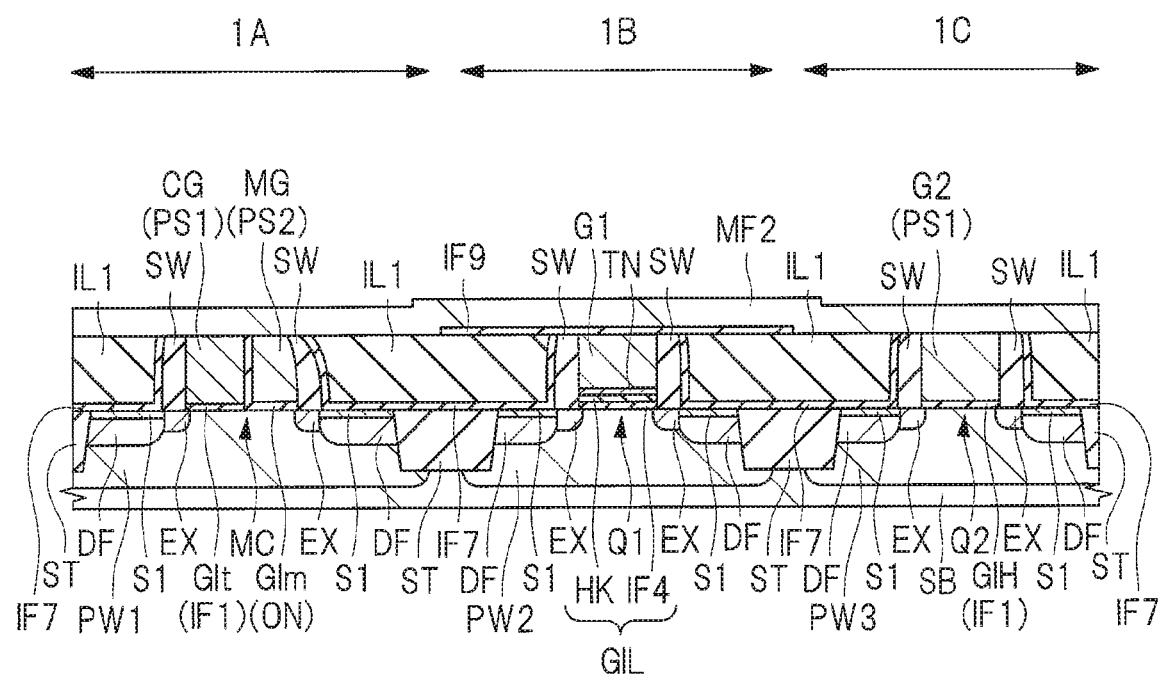
FIG. 18 is a cross-sectional view of a principal part during a manufacturing process of the semiconductor device, continued from FIG. 17.

That is, as shown in FIG. 18, the pattern of an insulating film IF9 that covers the peripheral circuit region 1B is formed by using, for example, a CVD method, a photolithography technique and an etching technique. The insulating film IF9 is an insulating film which exposes the upper surfaces of the control gate electrode CG and the memory gate electrode MG in the memory cell region 1A and the gate electrode G2 in the peripheral circuit region 1C and which covers the gate electrode G1 in the peripheral circuit region 1B, and is made of, for example, a silicon oxide film or others.

Subsequently, by performing a chemical dry etching process onto the main surface of the semiconductor substrate SB as a pretreatment, each excessive silicon oxide film or others on the control gate electrode CG, on the memory gate electrode MG, and on the gate electrode G2 is removed so as to expose each surface of the control gate electrode CG, the memory gate electrode MG, and the gate electrode G2.

Subsequently, a metal film MF2 for use in forming a silicide layer is formed (deposited) on the main surface of the semiconductor substrate SB including the upper surface of the memory gate electrode MG and the upper surface of the gate electrode G2. The film thickness of the metal film MF2 is set to, for example, 20 to 25 nm.

The metal film MF2 can be formed by a sputtering method using, for example, an alloy target formed by adding platinum (Pt) to nickel (Ni). The content (concentration) of platinum (Pt) that is an additive to the alloy target is set to less than 5%. The additive may be aluminum (Al), carbon (C) or others. The content (concentration) in this case is also set to less than 5%. However, platinum has higher heat resistance than that of aluminum, carbon or others, and therefore, can be preferably used for the alloy film. The metal film MF2 formed by the sputtering method using the alloy target is a nickel (Ni) film containing platinum (Pt), and the content of platinum (Pt) is less than 5%. Also here, nickel serving as a main material is referred to as first metal, and platinum (Pt) serving as an additive is referred to as second metal.

Next, by performing a third thermal treatment (referred to as third thermal treatment in order to be distinguished from the above-described first and second thermal treatments) onto the semiconductor substrate SB, the respective surface layer portions of the control gate electrode CG, the memory gate electrode MG, and the gate electrode G2 are allowed to react with the metal film MF2. This third thermal treatment is a thermal treatment for allowing the metal film MF2 to react with silicon of the control gate electrode CG, the memory gate electrode MG, and the gate electrode G2. By the third thermal treatment, a silicide layer in which NiSi fine crystals and $Ni_2Si$ are dominant is formed on the respective upper portions of the control gate electrode CG, the memory gate electrode MG, and the gate electrode G2. At this stage, the silicide layer is a silicide layer having comparatively high resistance which is different from the silicide layer S2 shown in FIG. 1. Moreover, since the platinum (Pt) serving as the additive has a small content as described above, no platinum silicide is formed, so that the crystals of the silicide layer comparatively high resistance and the silicide layer S2 to be explained later are described as NiSi and $Ni_2Si$ so as not to contain Pt. Next, after the third thermal treatment, the unreacted portion of the metal film MF2 with silicon is removed by wet etching or others, and then, fourth thermal treatment is performed onto the semiconductor substrate SB. The fourth thermal treatment is executed in order to promote the crystal growth of the silicide layer having comparatively high resistance to form the silicide layer S2 having sufficiently reduced resistance in which NiSi is dominant. The temperature of the fourth thermal treatment is higher than the temperature of the third thermal treatment. Thus, the silicide layer S2 made of NiSi is formed.

Figure 19:
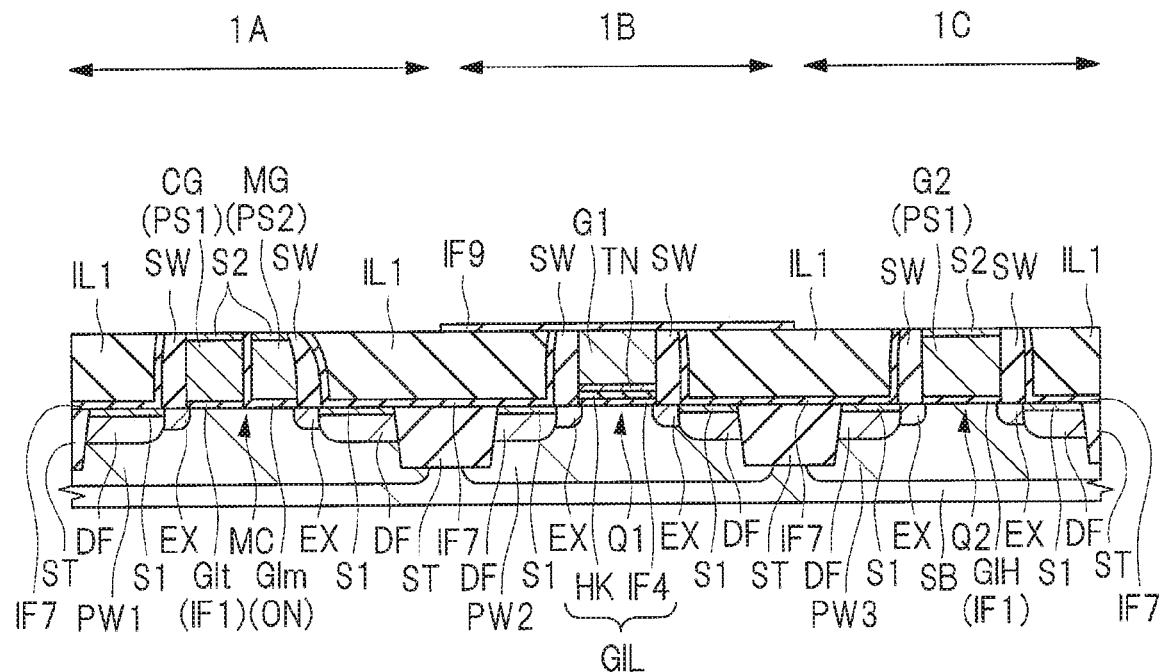
FIG. 19 is a cross-sectional view of a principal part during a manufacturing process of the semiconductor device, continued from FIG. 18.

In this manner, as shown in FIG. 19, the silicide layer S2 is selectively formed on the upper surfaces of the control gate electrode CG, the memory gate electrode MG and the gate electrode G2.

For the above-described third and fourth thermal treatments, for example, a thermal treatment apparatus for heating the semiconductor substrate by using a carbon heater is used. That is, in the fourth thermal treatment, the silicide layer S2 containing NiSi fine crystals and $Ni_2Si$ is formed by, for example, the heating at a temperature of about 260° C. for 10 to 30 seconds. Then, after the unreacted part of the metal film MF2 is removed by wet etching or others as described above, the fourth thermal treatment is further performed at 400° C. for 30 to 60 seconds, so that the NiSi crystals inside the silicide layer S2 is grown.

The silicide layer S2 formed in this manner is made of, for example, nickel silicide (NiSi) containing platinum. However, the layer is not always required to contain platinum (Pt). In the case containing platinum (Pt), the third thermal treatment can be executed at a lower temperature, so that the short circuit between the silicide layers S2 formed on the surfaces (upper surfaces) of the control gate electrode CG and the memory gate electrode MG can be prevented. In the split-gate type memory cell MC of the present embodiment, the upper surface of the control gate electrode CG, the upper surface of the memory gate electrode MG and the ends of the gate insulating film GIm have almost the same height as one another, and the silicide layer S2 is formed on the upper surface of the control gate electrode CG and the upper surface of the memory gate electrode MG. In other words, the silicide layer S2 on the upper surface of the control gate electrode CG and the silicide layer S2 on the upper surface of the memory gate electrode MG are configured to easily cause the short circuit therebetween. However, since platinum (Pt) is contained in the silicide layer S2, this configuration has such effect as preventing the above-described short circuit. If the silicide layer is formed by using a nickel (Ni) film not containing platinum (Pt), the temperature of the above-described third thermal treatment needs to be set to about 400° C. However, when the third thermal treatment is performed at such a high temperature, a problem of the short circuit between the control gate electrode CG and the memory gate electrode MG through the silicide layer is caused.

Here, the above-described fourth thermal treatment is performed at, for example, a temperature of 400° C. or less. In the present embodiment, as described above, it is important to execute the fourth thermal treatment at a temperature lower than that of the second thermal treatment. In this case, it is important to execute the fourth thermal treatment for a period of time longer than that of the second thermal treatment, and this long execution can achieve the sufficiently reduced resistance of the silicide layer S2. In this manner, by performing the fourth thermal treatment at a temperature lower than that of the second thermal treatment, each of the silicide layers S2 formed on the surfaces (upper surfaces) of the control gate electrode CG, the memory gate electrode MG and the gate electrode G2 can be formed as, for example, a film having tensile stress lower than that of the silicide layer S1 formed on the surface of the diffusion region DF, and therefore, the silicide layer S2 has such features as being difficult to disconnect and as having a small sheet resistance.

Figure 20:
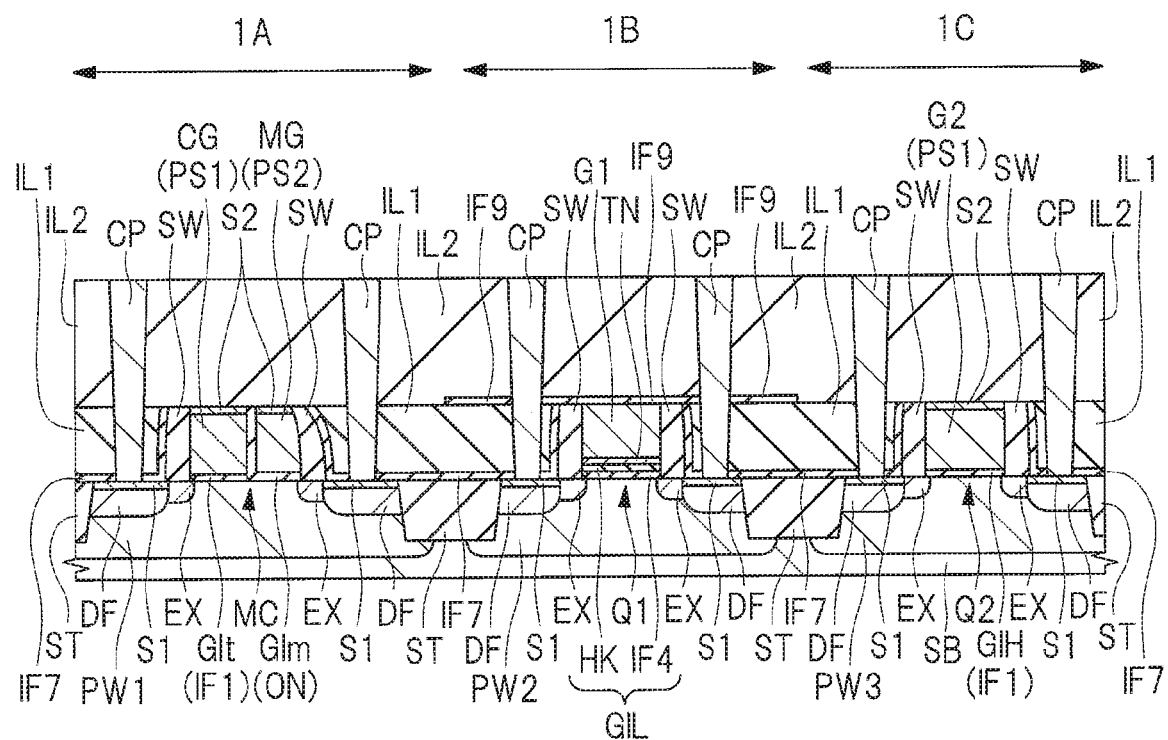
FIG. 20 is a cross-sectional view of a principal part during a manufacturing process of the semiconductor device, continued from FIG. 19.

Next, as shown in FIG. 20, an interlayer insulating film and a plurality of contact plugs are formed. Here, first, an interlayer insulating film IL2 that covers the upper surface of the semiconductor substrate SB including the memory cell region 1A and the peripheral circuit regions 1B and 1C is formed by using, for example, a CVD method. The interlayer insulating film IL2 is made of, for example, a silicon oxide film, and covers the respective upper surfaces of the control gate electrode CG, the memory gate electrode MG, the gate electrodes G1 and G2, and the interlayer insulating film IL1. In the peripheral circuit region 18B, the insulating film IF9 formed at the time of the formation of the silicide layer S2 is left. If needed, the insulating film IF9 may be removed before the formation of the interlayer insulating film IL2.

Subsequently, by using a photolithography technique, the interlayer insulating films IL2 and IL1 and the insulating films IF9 and IF7 are dry-etched while using the resist film (not shown) formed on the interlayer insulating film IL2 as an etching mask. Thus, a plurality of contact holes (openings, through holes) that penetrate the interlayer insulating film IL2 and a plurality of contact holes that penetrate the interlayer insulating films IL1 and IL2 and the insulating film IF7 are formed. Note that the contact holes in the peripheral circuit region 1B penetrate the insulating film IF9.

From the bottoms of the respective contact holes, a part of the main surface of the semiconductor substrate SB such as a part of the silicide layer S1 on the surface of the diffusion region DF, a part of the silicide layer S2 on the surface of the control gate electrode CG, a part of the silicide layer S2 on the surface of the memory gate electrode MG or a part of the gate electrodes G1 and G2 are exposed. Note that the contact holes on the respective gate electrodes are formed in regions not shown in FIG. 20.

Subsequently, inside the respective contact holes, conductive contact plugs CP made of tungsten (W) or others are formed as conductors for connection. In order to form the contact plugs CP, for example, a barrier conductor film (for example, titanium film, titanium nitride film or stacked film of them) is formed on the interlayer insulating film IL2 including the insides of the contact holes. Then, a main conductor film made of a tungsten film or others is formed on this barrier conductor film so as to completely fill the inside of the respective contact holes, and then, the unnecessary main conductor film and barrier conductor film outside each contact hole are removed by using a CMP method, an etching back method or others, so that the contact plugs CP can be formed. In order to simplify the drawing, note that FIG. 20 shows the barrier conductor film and the main conductor film (tungsten film) configuring the contact plug CP so as to be integrated.

The contact plug CP filled inside the contact hole is formed so as to be respectively connected to each upper portion of the diffusion region DF, the control gate electrode CG, the memory gate electrode MG, and the gate electrode G1 or the gate electrode G2. In other words, the contact plug CP is connected to the upper surface of each of the diffusion regions DF of the memory cell MC, the low breakdown voltage MISFET (Q1) and the high breakdown voltage MISFET (Q2), via the silicide layer S1. Moreover, the contact plug CP is connected to the upper surface of each of the control gate electrode CG, the memory gate electrode MG and the gate electrode G2, via the silicide layer S2.

Then, as shown in FIG. 1, on the interlayer insulating film IL2 into which the contact plug CP is buried, a first wiring layer M1 including a first-layer wiring is formed. A plurality of first-layer wirings are connected to the respective upper surfaces of the contact plugs CP shown in FIG. 1. Then, a second wiring layer, a third wiring layer or others are subsequently formed on the first wiring layer to form a stacked wiring layer, and then, the semiconductor wafer is divided into individual pieces by a dicing process, so that a plurality of semiconductor chips are obtained. As described above, the semiconductor device of the present embodiment is manufactured.

<Characteristics and Effects of Method for Manufacturing Semiconductor Device of Present Embodiment>

For example, in a method for manufacturing a semiconductor device having the MISFET (Q2), diffusion regions DF configuring a source region and a drain region are formed so as to sandwich a gate electrode G2 therebetween, and next, a silicide layer S1 is formed on the surfaces of the diffusion regions DF while the gate electrode G2 is covered with an insulating film IF2. Then, the insulating film IF2 on the gate electrode G2 is removed, and a silicide layer S2 is formed on the surface (upper surface) of the exposed gate electrode G2. The silicide layers S1 and S2 are formed of a first metal (for example, nickel) and silicon, and contain a second metal (for example, platinum) as an additive.

According to the above-described manufacturing method, since the silicide layer S1 and the silicide layer S2 are formed by different processes from each other, the additive concentration of the silicide layer S2 can be made lower than the additive concentration of the silicide layer S1. That is, a leak current in the source region or the drain region of the MISFET (Q2) can be reduced, and the sheet resistance of the silicide layer S2 on the gate electrode G2 can also be reduced.

In the formation of the above-described silicide layers S1 and S2, by setting the fourth thermal treatment temperature for forming the silicide layer S2 to a temperature lower than the second thermal treatment temperature for forming the silicide layer S1, the tensile stress exerted inside the silicide layer S2 can be reduced, so that the prevention of the disconnection of the gate electrode G2 and the reduction of the resistance can be achieved.

Moreover, the above-described semiconductor device further has the MISFET (Q1) having the metal gate electrode G1. In the MISFET (Q2), diffusion regions DF forming the source region and the drain region are formed on both ends of the dummy electrode DG, and next, the silicide layer S1 is formed on the surface of the diffusion regions D while the dummy gate electrode DG is covered with the insulating film IF5. Moreover, after the insulating film IF5 on the dummy gate electrode DG is removed, the dummy gate electrode DG is removed, and the metal gate electrode G1 is formed. The process for forming the silicide layer S1 of the MISFET (Q2) is performed by the same process as the process for forming the silicide layer S1 of the MISFET (01). Furthermore, the process for removing the insulating film IF2 on the gate electrode G2 of the MISFET (Q2) is performed by the same process as the process for removing the insulating film IF5 on the dummy gate electrode DG. That is, by utilizing (sharing) the process for forming the MISFET (Q1) having the metal gate electrode G1, the silicide layers S1 and S2 of the MISFET (Q2) are formed by different processes.

For example, in a method for manufacturing a semiconductor device having a nonvolatile memory cell MC, the diffusion regions DF for forming the source region and the drain region are formed so as to sandwich the control gate electrode CG and the memory gate MG, and next, a silicide layer S1 is formed on the surfaces of the memory gate electrode MG and the diffusion layers DF while the control gate electrode CG is covered with the insulating film IF2. Then, by removing the insulating film IF2 on the control gate electrode CG and the silicide layer S1 on the memory gate electrode MG, a silicide layer S2 is formed on the surfaces (upper surfaces) of the exposed control gate electrode CG and memory gate electrode MG. The silicide layers S1 and S2 are formed of a first metal (for example, nickel) and silicon, and contain a second metal (for example, platinum) as an additive.

According to the above-described manufacturing method, since the silicide layer S1 and the silicide layer S2 are formed by different processes from each other, the additive concentration of the silicide layer S2 can be made lower than the additive concentration of the silicide layer S1. That is, a leak current in the source region or the drain region of the nonvolatile memory cell can be reduced, the sheet resistance of the silicide layer S2 on each of the control gate electrode CG and on the memory gate electrode MG can also be reduced, and the high-speed operation of the semiconductor device having the nonvolatile memory cell MC can be achieved.

In the formation of the above-described silicide layers S1 and S2, by setting the fourth thermal treatment temperature for forming the silicide layer S2 to a temperature lower than the second thermal treatment temperature for forming the silicide layer S1, the tensile stress exerted inside the silicide layer S2 can be reduced, so that the prevention of the disconnection of the control gate electrode CG and the memory gate electrode MG and the reduction of the resistance can be achieved.

Moreover, in the formation of the above-described silicide layer S2, by the usage of the nickel film containing platinum, the third thermal treatment temperature can be lower than that in the usage of the nickel film not containing platinum, the short circuit between the silicide layer S2 on the control gate electrode CG and the silicide layer S2 on the memory gate electrode MG can be prevented.

Next, modified examples of the present embodiment will be described.

First Modified Example

Figure 13:
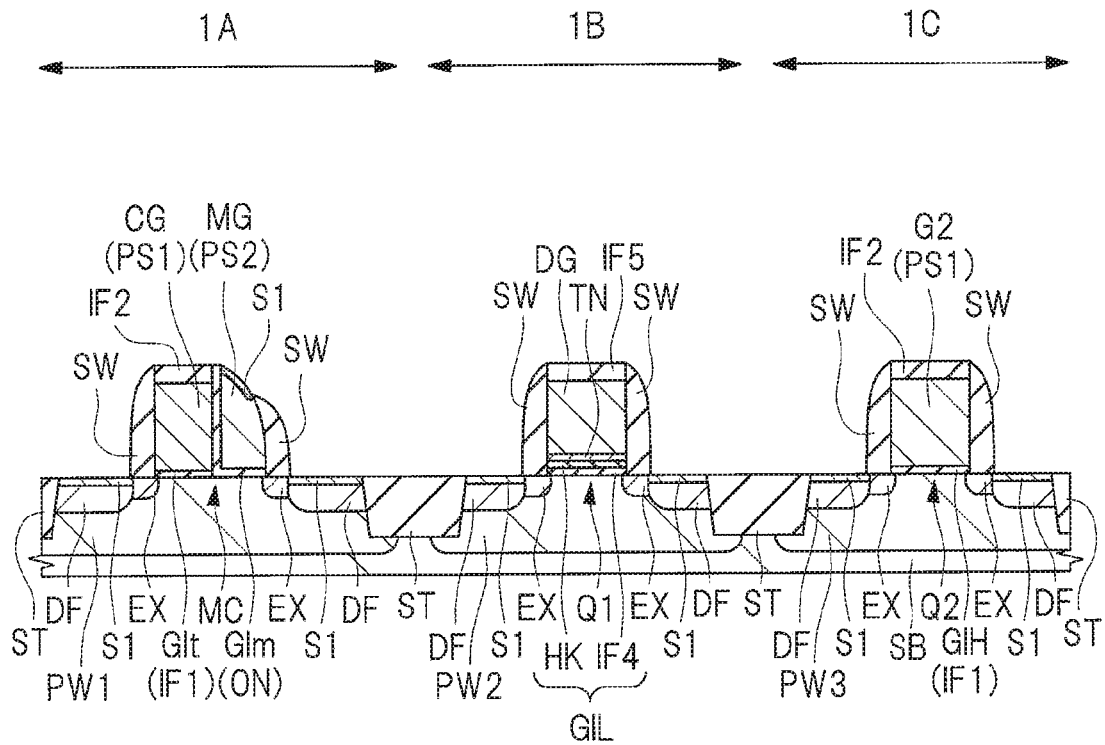
FIG. 13 is a cross-sectional view of a principal part during a manufacturing process of the semiconductor device, continued from FIG. 12.

As explained with reference to FIG. 13, in the above-described embodiment, after the metal film MF1 is formed by a sputtering method using an alloy target formed by adding platinum (Pt) to nickel (Ni), the silicide layer S1 is formed by performing the above-described first and second thermal treatments on the semiconductor substrate SB.

In a first modified example, after a metal film MF3 is formed by a sputtering method or a CVD method using a nickel (Ni) target not containing platinum (Pt), platinum (Pt) is introduced into the metal film MF3 by using an ion implantation method. Then, by performing the above-described first and second thermal treatments on the metal film MF3 to which platinum (Pt) has been introduced, the silicide layer S1 can be formed. Of course, the content (concentration) of platinum (Pt) contained in the silicide layer S1 is set to 5% or more (more preferably, 5% or more and 10% or less).

Moreover, in the formation of the silicide layer S2, as similar to the above description, after a metal film MF4 is formed by a sputtering method or a CVD method using a nickel (Ni) target not containing platinum (Pt), platinum (Pt) may be introduced into the metal film MF4 by using an ion implantation method. Then, by performing the above-described third and fourth thermal treatments on the metal film MF4 to which platinum (Pt) has been introduced, the silicide layer S2 can be formed. Of course, the content (concentration) of platinum (Pt) contained in the silicide layer S2 is set to less than 5%.

Note that both of the silicide layer S1 and the silicide layer S2 may not be formed by using the method of the first modified example. For example, one of them may be formed by using the method of the first modified example, and the other may be formed by using the method of the first embodiment.

Second Modified Example

A second modified example relative to the first modified example will be described.

In the first modified example, after platinum (Pt) is introduced to the metal film MF3 by using an ion implantation method, the above-described first and second thermal treatments are performed, so that the silicide layer S1 is formed. However, in the second modified example, after the first and second thermal treatments, platinum (Pt) is introduced into the silicide layer S1 by using the ion implantation method. That is, a silicide layer (referred to as "sub-silicide layer") not containing platinum (Pt) is formed by the above-described first and second thermal treatments, and platinum (Pt) is ion implanted into the sub-silicide layer, so that a silicide layer S1 containing platinum (Pt) is formed. Of course, the content (concentration) of platinum (Pt) contained in the silicide layer S1 is set to 5% or more (more preferably, 5% or more and 10% or less).

Moreover, also in the formation of the silicide layer S2, as similar to the above description, after the third and fourth thermal treatments, platinum (Pt) is introduced into the silicide layer S2 by using the ion implantation method. That is, a sub-silicide layer not containing platinum (Pt) is formed by the above-described third and fourth thermal treatments, and platinum (Pt) is ion implanted into the sub-silicide layer, so that a silicide layer S2 containing platinum (Pt) is formed. Of course, the content (concentration) of platinum (Pt) contained in the silicide layer S2 is set to less than 5%.

According to the second modified example, the abnormal growth of the silicide layer relative to a thermal load after the formation of the silicide layer S1 can be suppressed, and so that the leak current in the source region and the drain region can be reduced.

Note that both of the silicide layer S1 and the silicide layer S2 may not be formed by using the method of the second modified example. For example, one of them may be formed by using the method of the second modified example, and the other may be formed by using the method of the first embodiment or the first modified example.

In the above-described embodiment and modified embodiments, the explanations have been made while exemplifying a memory cell having a split-gate type MONOS structure having a control gate electrode and a memory gate electrode sandwiched by a source region and a drain region as a nonvolatile memory cell. However, a memory cell having a single-gate type MONOS structure may be also applicable. The memory cell in this case has: a source region and a drain region formed inside a semiconductor substrate; a gate electrode; and a stacked film which is formed between the semiconductor substrate and the gate electrode and which includes a silicon oxide film OX1, a silicon nitride film NT formed on the silicon oxide film OX1 and a silicon oxide film OX2 formed on the silicon nitride film NT. Moreover, the above-described silicide layer S1 is formed on the surfaces of the source region and the drain region, and the silicide layer S2 is formed on the gate electrode, and the content (concentration) of an additive (for example, platinum) contained in the silicide layer S2 is set to be lower than the content (concentration) of an additive (for example, platinum) contained in the silicide layer S1.

In the foregoing, the invention made by the present inventor has been concretely described based on the embodiments. However, it is needless to say that the present invention is not limited to the foregoing embodiments and various modifications and alterations can be made within the scope of the present invention.

For example, in the present embodiment, nickel (Ni) is exemplified as the first metal. However, in place of this, titanium (Ti) or cobalt can be also used. Moreover, platinum (Pt) is exemplified as the second metal. However, in place of this, tantalum (Ta), palladium (Pd), aluminum (Al), manganese (Mn) or tungsten (W) can be also used.

In addition, a part of the contents described in the above-described embodiment will be described below.

[Additional Note 1]

In a semiconductor device having a first MISFET in a first region of a semiconductor substrate, the first MISFET includes: a first gate insulating film formed on the semiconductor substrate in the first region; a first gate electrode formed on the first gate insulating film; first impurity regions which are formed inside the semiconductor substrate so as to sandwich the first gate electrode in the first region and which configure a part of a first source region and a part of a first drain region; a first silicide layer which is formed on the first impurity region and which contains a first metal and silicon; and a second silicide layer which is formed in an upper portion of the first gate electrode and which contains the first metal and silicon. A second metal different from the first metal is added into the first silicide layer, and a concentration of the second metal inside the second silicide layer is lower than a concentration of the second metal inside the first silicide layer.

EXPLANATION OF REFERENCE CHARACTERS 1A memory cell region
1B, 1C peripheral circuit region
CG control gate electrode
CP contact plug
DF diffusion region
DG dummy gate electrode
EX extension region
G1, G2 gate electrode
GIm, GIt, GIH, GIL gate insulating film
HK insulating film
IF1 to IF9 insulating film
IL1, IL2 interlayer insulating film
M1 wiring layer
MC memory cell
MF1, MF2, MF3, MF4 metal film
MG memory gate electrode
ON insulating film
PS1, PS2, PS3 silicon layer
PW1, PW2, PW3 p-type well
Q1, Q2 MISFET
SB semiconductor substrate
S1, S2 silicide layer
ST element isolation region
SW sidewall
TN metal film

The invention claimed is:

1. A method for manufacturing a semiconductor device to provide a first Metal Insulator Semiconductor Field Effect Transistor (MISFET) in a first region of a semiconductor substrate, the method comprising:
 (a) forming a first gate insulating film on the semiconductor substrate in the first region;
 (b) forming a first gate electrode containing silicon on the first gate insulating film;
 (c) forming first impurity regions inside the semiconductor substrate, the first impurity regions located on opposite sides of the first gate electrode and configuring a part of a first source region and a part of a first drain region;
 (d) forming a first silicide layer on the first impurity region;

(e) forming a first insulating film on the semiconductor substrate so as to cover the first gate electrode and the first silicide layer;

(f) polishing the first insulating film so as to expose the first gate electrode; and (g) forming a second silicide layer on the first gate electrode, wherein the (d) further includes:

(d1) forming a first film including a first metal, to which a second metal is added, on the first impurity region;

(d2) performing a first thermal treatment onto the semiconductor substrate having the first film formed therein; and (d3) after the (d2), performing a second thermal treatment, which has a temperature higher than a temperature of the first thermal treatment, onto the semiconductor substrate, wherein the (g) further includes:

(g1) forming a second film including the first metal, to which the second metal is added, on the first gate electrode;

(g2) performing a third thermal treatment onto the semiconductor substrate having the second film formed therein; and (g3) after the (g2), performing a fourth thermal treatment, which has a temperature higher than a temperature of the third thermal treatment, onto the semiconductor substrate, wherein the temperature of the fourth thermal treatment is lower than the temperature of the second thermal treatment, wherein each of the first and second silicide layers contains the first metal and silicon, and further contains an additive including the second metal different from the first metal, and wherein a concentration of the second metal inside the second silicide layer is more than 0% and less than 5%, and a concentration of the second metal inside the first silicide layer is equal to or more than 5% and equal to or less than 10%.

2. The method for manufacturing the semiconductor device according to claim 1, wherein the second thermal treatment is performed at the temperature of 400° C. or higher, wherein the fourth thermal treatment is performed at the temperature lower than 400° C., and wherein a period of time during which the fourth thermal treatment is performed is longer than a period of time during which the second thermal treatment is performed.

3. The method for manufacturing the semiconductor device according to claim 1, wherein the semiconductor device includes a second MISFET formed in a second region different from the first region of the semiconductor substrate, wherein the method further includes:

(h) before the (b), forming a second gate insulating film on the semiconductor substrate in the second region;

(i) in the (b), forming a dummy gate electrode on the second gate insulating film in the second region;

(j) forming second impurity regions inside the semiconductor substrate so as to sandwich the dummy gate electrode in the second region, the second impurity regions configuring a part of a second source region and a part of a second drain region;

(k) in the (d), forming a third silicide layer on the second impurity regions in the second region;

(l) in the (e), forming the first insulating film on the semiconductor substrate in the second region so as to cover the dummy gate electrode and the third silicide layer;

(m) in the (f), polishing an upper surface of the first insulating film in the second region so as to expose the dummy gate electrode;

(n) between the (f) and the (g), removing the dummy gate electrode in the second region;

(o) after the (n), burying a metal film in a region from which the dummy gate electrode has been removed in the second region; and (p) after the (o), polishing the metal film in the second region so as to expose the first insulating film, wherein the third silicide layer contains the first metal and silicon, and further contains an additive including the second metal, and wherein a concentration of the second metal inside the second silicide layer is lower than a concentration of the second metal in the third silicide layer.

4. The method for manufacturing the semiconductor device according to claim 1, wherein the first metal includes nickel, and wherein the second metal includes platinum.

5. The method for manufacturing the semiconductor device according to claim 1, wherein the temperature of the fourth thermal treatment is lower than the temperature of the second thermal treatment, and a period of time during which the fourth thermal treatment is performed is longer than a period of time during which the second thermal treatment is performed, wherein an execution of the fourth thermal treatment is subsequent in time from an execution of the second thermal treatment, and wherein the first silicide layer and the second silicide layer are formed at different times and with different processes.

6. The method for manufacturing the semiconductor device according to claim 1, wherein the temperature of the fourth thermal treatment is lower than the temperature of the second thermal treatment and a period of time during which the fourth thermal treatment is performed is longer than a period of time during which the second thermal treatment is performed, such that the second silicide layer formed on an upper surface of the first gate electrode is formed as a film having tensile stress lower than that of the first silicide layer formed on the first impurity region.

7. A method for manufacturing a semiconductor device including a plurality of nonvolatile memory cells formed in a first region of a semiconductor substrate, the method comprising:

(a) forming a first gate insulating film on the semiconductor substrate in the first region;

(b) forming a first gate electrode on the first gate insulating film;

(c) forming a second gate insulating film including a charge storage film on the semiconductor substrate in the first region;

(d) forming a second gate electrode on the second gate insulating film;

(e) after the (d), forming first impurity regions inside the semiconductor substrate in the first region, the first impurity regions located on opposite sides of a structure including the first gate electrode and the second gate electrode and configuring a part of a first source region and a part of a first drain region;

(f) forming a first silicide layer on the first impurity region;
(g) forming a first insulating film on the semiconductor substrate so as to cover the first gate electrode, the second gate electrode, and the first silicide layer;
(h) polishing the first insulating film so as to expose the first gate electrode and the second gate electrode; and
(i) forming a second silicide layer and a third silicide layer on the first gate electrode and the second gate electrode, respectively, wherein the (f) further includes:
(f1) forming a first film including a first metal, to which a second metal is added, on the first impurity region;
(f2) performing a first thermal treatment onto the semiconductor substrate having the first film formed therein; and
(f3) after the (f2), performing a second thermal treatment, which has a temperature higher than a temperature of the first thermal treatment, onto the semiconductor substrate, wherein the (i) further includes:
(i1) forming a second film including the first metal, to which the second metal is added, on the first gate electrode and the second gate electrode;
(i2) performing a third thermal treatment onto the semiconductor substrate having the second film formed therein; and
(i3) after the (i2), performing a fourth thermal treatment, which has a temperature higher than a temperature of the third thermal treatment, onto the semiconductor substrate, wherein the temperature of the fourth thermal treatment is lower than the temperature of the second thermal treatment, wherein each of the first silicide layer, the second silicide layer, and the third silicide layer contains the first metal and silicon, wherein the second metal different from the first metal is added into the first silicide layer, the second silicide layer, and the third silicide layer, and wherein a concentration of the second metal inside the second silicide layer and a concentration of the second metal inside the third silicide layer are more than 0% and less than 5%, and a concentration of the second metal inside the first silicide layer is equal to or more than 5% and equal to or less than 10%.

8. The method for manufacturing the semiconductor device according to claim 7, wherein the second thermal treatment is performed at the temperature of 400° C. or higher and 600° C. or lower,
wherein the fourth thermal treatment is performed at the temperature lower than 400° C., and
wherein a period of time during which the fourth thermal treatment is performed is longer than a period of time during which the second thermal treatment is performed.

9. The method for manufacturing the semiconductor device according to claim 7, wherein the semiconductor device includes a Metal Insulator Semiconductor Field Effect Transistor (MISFET) formed in a second region different from the first region of the semiconductor substrate,
wherein the method further includes:
(j) before the (b), forming a third gate insulating film on the semiconductor substrate in the second region;
(k) in the (b), forming a dummy gate electrode on the third gate insulating film in the second region;
(l) forming second impurity regions inside the semiconductor substrate in the second region so as to sandwich the dummy gate electrode, the second impurity regions configuring a part of a second source region and a part of a second drain region;
(m) in the (f), forming a fourth silicide layer on the second impurity regions in the second region;
(n) in the (g), forming the first insulating film on the semiconductor substrate in the second region so as to cover the dummy gate electrode and the fourth silicide layer;
(o) in the (h), polishing an upper surface of the first insulating film in the second region so as to expose the dummy gate electrode;
(p) between the (h) and the (i), removing the dummy gate electrode in the second region;
(q) after the (p), burying a metal film in a region from which the dummy gate electrode has been removed in the second region; and
(r) after the (q), polishing the metal film in the second region so as to expose the first insulating film,
wherein the fourth silicide layer includes the first metal and silicon, and further contains an additive including the second metal, and
wherein a concentration of the second metal inside the second silicide layer is lower than a concentration of the second metal inside the fourth silicide layer.

10. The method for manufacturing the semiconductor device according to claim 7, wherein the temperature of the fourth thermal treatment is lower than the temperature of the second thermal treatment, and a period of time during which the fourth thermal treatment is performed is longer than a period of time during which the second thermal treatment is performed,
wherein an execution of the fourth thermal treatment is subsequent in time from an execution of the second thermal treatment, and
wherein the first silicide layer and the second silicide layer are formed at different times and with different processes.

11. The method for manufacturing the semiconductor device according to claim 7, wherein the temperature of the fourth thermal treatment is lower than the temperature of the second thermal treatment and a period of time during which the fourth thermal treatment is performed is longer than a period of time during which the second thermal treatment is performed, such that the second silicide layer formed on an upper surface of the first gate electrode is formed as a film having tensile stress lower than that of the first silicide layer formed on the first impurity region.

* * * * *